United States Patent
Kidoh et al.

(10) Patent No.: US 8,363,481 B2
(45) Date of Patent: Jan. 29, 2013

(54) NON-VOLATILE SEMICONDUCTOR MEMORY DEVICE AND METHOD OF MAKING THE SAME

(75) Inventors: Masaru Kidoh, Kawasaki (JP); Hiroyasu Tanaka, Minato-ku (JP); Masaru Kito, Yokohama (JP); Ryota Katsumata, Yokohama (JP); Hideaki Aochi, Kawasaki (JP); Mitsuru Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 595 days.

(21) Appl. No.: 12/521,997

(22) PCT Filed: Jan. 31, 2008

(86) PCT No.: PCT/JP2008/051999
§ 371 (c)(1),
(2), (4) Date: Jul. 2, 2009

(87) PCT Pub. No.: WO2008/096802
PCT Pub. Date: Aug. 14, 2008

(65) Prior Publication Data
US 2010/0039865 A1 Feb. 18, 2010

(30) Foreign Application Priority Data
Feb. 5, 2007 (JP) ................................. 2007-026168

(51) Int. Cl.
*G11C 16/06* (2006.01)
(52) U.S. Cl. ......... 365/185.23; 365/185.17; 365/185.18; 257/324; 257/326; 257/329
(58) Field of Classification Search ............. 365/185.23, 365/185.17, 185.18; 257/324, 326, 329
See application file for complete search history.

(56) References Cited

U.S. PATENT DOCUMENTS
7,936,004 B2 * 5/2011 Kito et al. ...................... 257/324
(Continued)

FOREIGN PATENT DOCUMENTS
EP 1 179 850 2/2002
EP 1 246 247 10/2002
(Continued)

OTHER PUBLICATIONS

Endoh, T. et al., "Novel Ultrahigh-Density Flash Memory With a Stacked-Surrounding Gate Transistor (S-SGT) Structured Cell", IEEE Transactions on Electron Devices, vol. 50, No. 4, pp. 945-951, (2003).

(Continued)

*Primary Examiner* — Toan Le
(74) *Attorney, Agent, or Firm* — Oblon, Spivak, McClelland, Maier & Neustadt, L.L.P.

(57) ABSTRACT

A non-volatile semiconductor memory device according to the present invention includes a substrate; a first word-line provided above the substrate surface, the first word-line having a plate shape in an area where a memory cell is formed; a second word-line provided above the first word-line surface, the second word-line having a plate shape; a plurality of metal wirings connecting the first and second word-lines with a driver circuit; and a plurality of contacts connecting the first and second word-lines with the metal wirings. The contact of the first word-line is formed in a first word-line contact area. The contact of the second word-line is formed in a second word-line contact area. The first word-line contact area is provided on a surface of the first word-line that is drawn to the second word-line contact area.

11 Claims, 32 Drawing Sheets

U.S. PATENT DOCUMENTS

| | | |
|---|---|---|
| 7,952,136 B2 | 5/2011 | Kito et al. |
| 2002/0036308 A1 | 3/2002 | Endoh et al. |
| 2002/0154556 A1 | 10/2002 | Endoh et al. |
| 2009/0108333 A1 | 4/2009 | Kito et al. |

FOREIGN PATENT DOCUMENTS

| | | |
|---|---|---|
| JP | 6-338602 | 12/1994 |
| JP | 8-203999 | 8/1996 |
| JP | 2002-57231 | 2/2002 |
| JP | 2003 078044 | 3/2003 |
| JP | 2006-128390 | 5/2006 |

OTHER PUBLICATIONS

Taiwanese Office Action issued Sep. 5, 2011, in Patent Application No. 097104090.

Office Action issued Mar. 21, 2011, in Korean Patent Application No. 10-2009-7018580 with English translation.

Korean Office Action issued Jul. 30, 2012, in Korea Patent Application No. 10-2009-7018580 (with English translation).

Japanese Office Action issued May 1, 2012, in Patent Application No. 2007-026168 (with English-language translation).

* cited by examiner

NON-VOLATILE SEMICONDUCTOR MEMORY DEVICE AND METHOD OF MAKING THE SAME

FIELD OF THE INVENTION

The present invention relates to semiconductor memory devices that are capable of electrically rewriting data, and more particularly, to non-volatile semiconductor memory devices.

DESCRIPTION OF THE RELATED ART

Compact and large-capacity non-volatile semiconductor memory devices have been increasingly required. NAND flash memories draw attention to the possibility of higher integration and a larger capacity. With general manufacturing methods, it becomes harder to fabricate fine patterns such as word-lines and wirings, making it harder to provide a larger capacity by a smaller design rule.

For the purpose of more highly integrated memory devices, a large number of semiconductor memory devices have recently been proposed that include three-dimensionally disposed memory cells (see, for example, JP 2003-078044, U.S. Pat. No. 5,599,724, U.S. Pat. No. 5,707,885, and Endoh et al., "Novel Ultrahigh-Density Flash Memory With a Stacked-Surrounding Gate Transistor (S-SGT) Structured Cell," IEEE TRANSACTIONS ON ELECTRON DEVICES, VOL. 50, No. 4, pp. 945-951, April 2003).

Many of the conventional semiconductor memory devices including three-dimensionally disposed memory cells require, for each memory cell layer, a plurality of photo-etching processes (this process is hereinafter referred to as a "PEP," i.e., a patterning process including a lithography process using a photoresist and a fabrication process such as etching). A photo-etching process causing a minimum line width of the design rule is hereinafter referred to as a "critical PEP." A photo-etching process causing a line width larger than the minimum line width of the design rule is hereinafter referred to as a "rough PEP." The conventional semiconductor memory devices including three-dimensionally disposed memory cells require three or more critical PEP for each memory cell layer. Many of the conventional semiconductor memory devices simply laminate of memory cells. This inevitably causes a cost increase due to the three-dimensional structure.

In the three-dimensionally disposed memory cells, many contact holes are formed on polysilicon layers (or amorphous silicon layers) for the word-line electrodes or metal layers. If all contact holes may be formed by a single process, the number of fabrication processes may be directly reduced, providing more cost reduction.

DISCLOSURE OF THE INVENTION

An embodiment of the present invention is a non-volatile semiconductor memory device comprising: a substrate; a first word-line provided above the substrate surface, the first word-line having a plate shape in an area where a memory cell is formed; a second word-line provided above the first word-line surface, the second word-line having a plate shape; a plurality of metal wirings connecting the first and second word-lines with a driver circuit; and a plurality of contacts connecting the first and second word-lines with the metal wirings, a contact area for forming the contact of the first word-line being provided on a surface of the first word-line, the surface of the first word line is drawn to a contact area for forming the contact of the second word-line.

Another embodiment of the present invention is a method of making a non-volatile semiconductor memory device, comprising: forming a first insulating layer on a semiconductor substrate; forming a resist of a desired pattern on the first insulating layer and anisotropically etching the first insulating layer; performing n (n is a natural number) repetition of reduction of the resist by a predetermined width and additional anisotropic etching of the first insulating layer to make an opening on the first insulating layer; laminating (n+1) alternate layers of an electrically conductive film and a second insulating layer on the first insulating layer with the opening; alternately and selectively etching the conductive film and the second insulating layer to expose a surface of a top conductive film included in the laminated conductive films; and forming, on each exposed surface of the electrically conductive films, a contact hole connected to a driver circuit.

DESCRIPTION OF THE EMBODIMENTS

Figure 1:
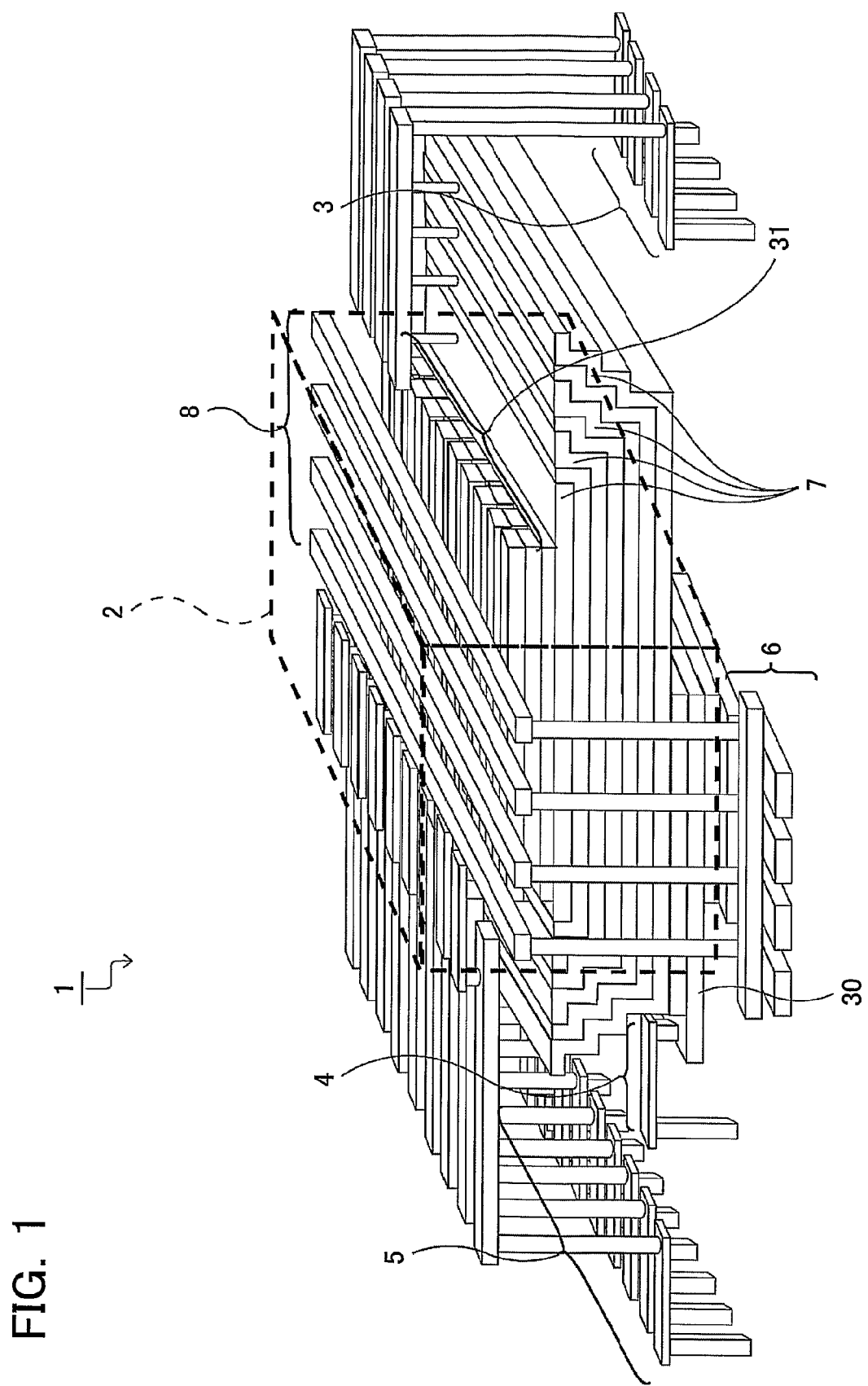
FIG. 1 is a schematic configuration diagram of a non-volatile semiconductor memory device 1 according to a first embodiment of the present invention.

Descriptions are now given of non-volatile semiconductor memory devices according to preferred embodiments of the present invention and methods of making the same. The present invention is not, however, limited to the disclosed embodiments. In each embodiment, like components are referred to by like reference numerals, and their description may be omitted.

First Embodiment

FIG. 1 shows a schematic configuration diagram of a non-volatile semiconductor memory device 1 according to a first embodiment of the present invention. The non-volatile semiconductor memory device 1 according to the first embodiment of the present invention includes components such as a memory transistor area 2, a word-line driver circuit 3, a source select gate line (SGS) driver circuit 4, a drain select gate line (SGD) driver circuit 5, a sense amplifier 6, a word-line WL (7), a bit-line BL 8, a source select gate line SGS 30, and a drain select gate line SGD 31. With reference to FIG. 1, in the non-volatile semiconductor memory device 1 according to the first embodiment of the present invention, the memory transistor area 2 includes a plurality of memory transistors. The memory transistors are collectively formed by depositing a plurality of laminated semiconductor layers. Also with reference to FIG. 1, the word-line WL (7) in each semiconductor layer extends in the memory transistor area 2 two-dimensionally, i.e., it extends in a plane. Each word-line WL (7) other than the top word-line WL (7) is formed as follows. At least an end of the word-line WL (7) in a direction perpendicular to the bit-line BL 8 is bent upward from (in a direction away from) the substrate and is drawn to a position below an upper select transistor SDTr layer. The end is then bent horizontally to have a plane. Each word-line WL (7) is drawn upward by being bent several times to form a stepped structure. The plane of the top word-line WL (7) and the planes of the other word-lines WL (7) are formed to be in the same plane. Each word-line WL (7) and the word-line driver circuit 3 are connected via a contact. Each contact is formed on the upper surface of the respective ends of the word-lines being in the same plane. Each contact thus has the same height.

Figure 2:
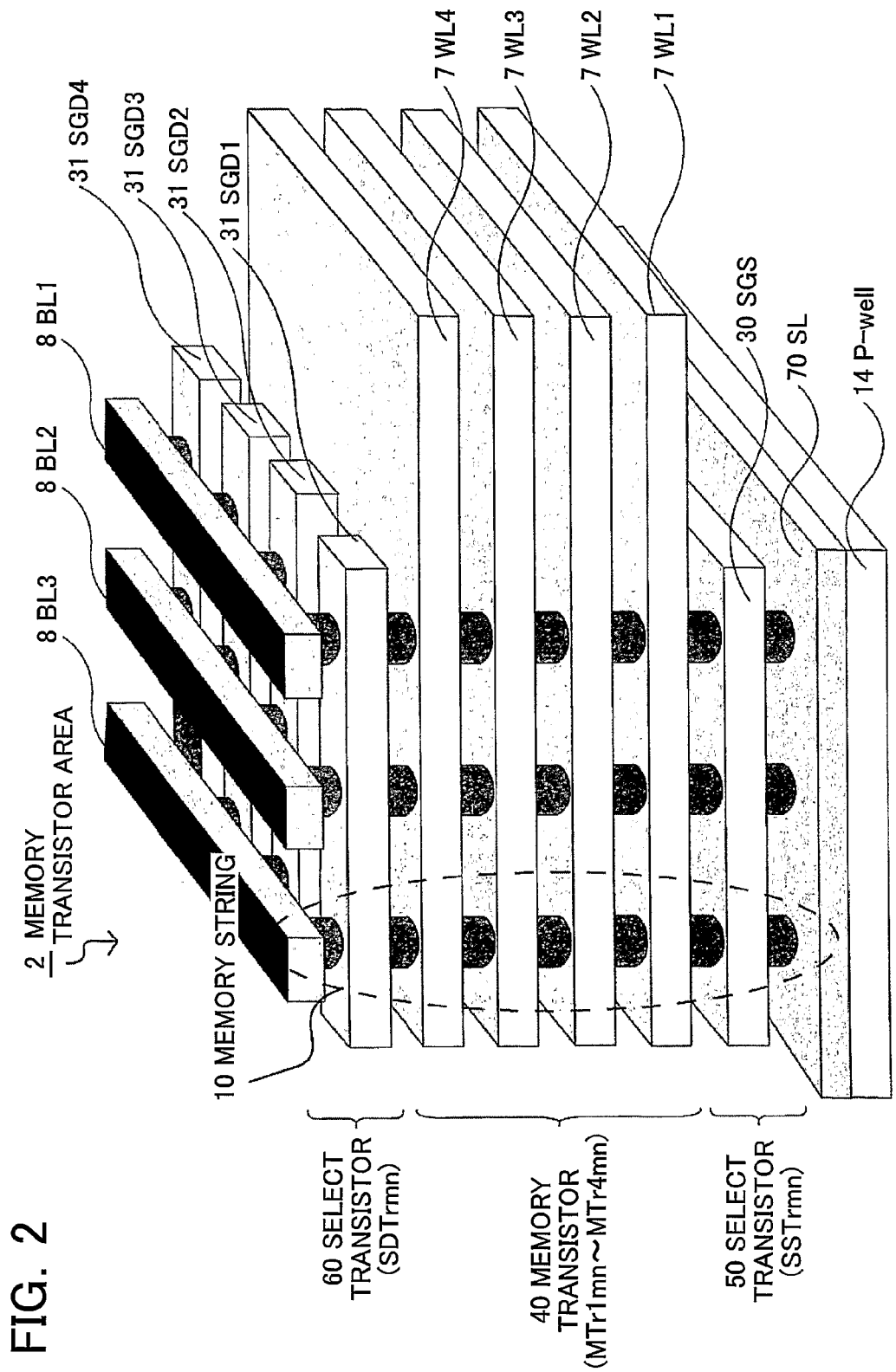
FIG. 2 is a schematic configuration diagram of a portion of the memory transistor area 2 in a non-volatile semiconductor memory device 1 according to the first embodiment of the present invention.

FIG. 2 is a schematic configuration diagram of a portion of the memory transistor area 2 in the non-volatile semiconductor memory device 1 according to the first embodiment of the present invention. In this embodiment, the memory transistor area 2 includes m [multiplied by] n memory strings 10 (m and n are natural numbers). Each memory string 10 includes memory transistors (MTr1$mn$ to MTr4$mn$) 40 and select transistors SSTr$mn$ 50 and SDTr$mn$ 60. FIG. 2 shows an example for m=3 and n=4.

The memory transistors (MTr1$mn$ to MTr4$mn$) 40 of each memory string 10 have gates, to which word-lines WL1 to WL4 (7) are connected, respectively. Each word-line is made of the same electrically-conductive layer and is common to each memory string 10. With reference to FIGS. 1 and 2, in the non-volatile semiconductor memory device 1 according to the first embodiment of the present invention, each of the word-lines WL1 to WL4 (7) extends two-dimensionally, thereby having a plate plane structure. Each of the word-lines WL1 to WL4 (7) has a plane structure generally perpendicular to the memory string 10. The source select transistor SSTr$mn$ 50 is driven by the source select gate line SGS 30. In operation, the gate line SGS 30 may always be at a potential common to each memory string. Although the source select gate line SGS 30 has a plate structure in this embodiment, the present invention is not limited thereto. The gate line SGS 30 may have a plurality of wiring structures that are separated and insulated. The drain select gate line SGD 31 may also have a plate structure or separated and insulated wiring structures. At least one of the source select gate line SGS 30 and the drain select gate line SGD 31 has, however, the separated and insulated wiring structures.

Each memory string 10 includes a columnar semiconductor on an n+ area (not shown) formed on a p-well area of the semiconductor substrate. The memory strings 10 are arranged in a matrix in a plane perpendicular to the columnar semiconductor. Note that the columnar semiconductor may be cylindrical or prism. The columnar semiconductor may have a structure that is symmetrical about the same center line. The columnar semiconductor may also have a stepped structure including laminated columnar semiconductors: one columnar semiconductor having a shape symmetrical about a center line and another columnar semiconductor having a different center line.

Figure 3B:
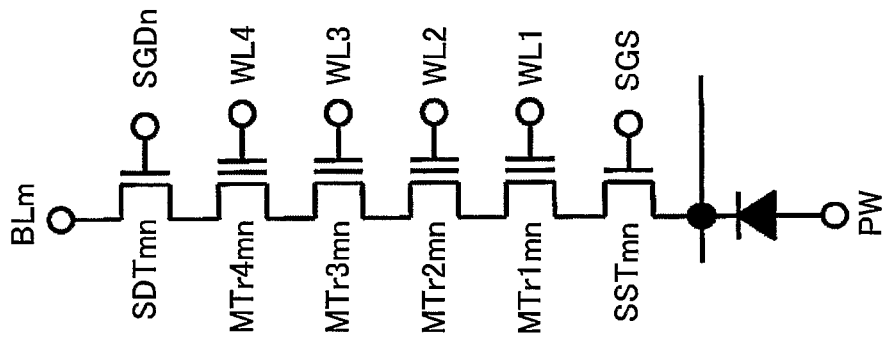
FIGS. 3A and 3B show schematic structures of one memory string 10 of a non-volatile semiconductor memory device 1 according to the first embodiment of the present invention.
Figure 3A:
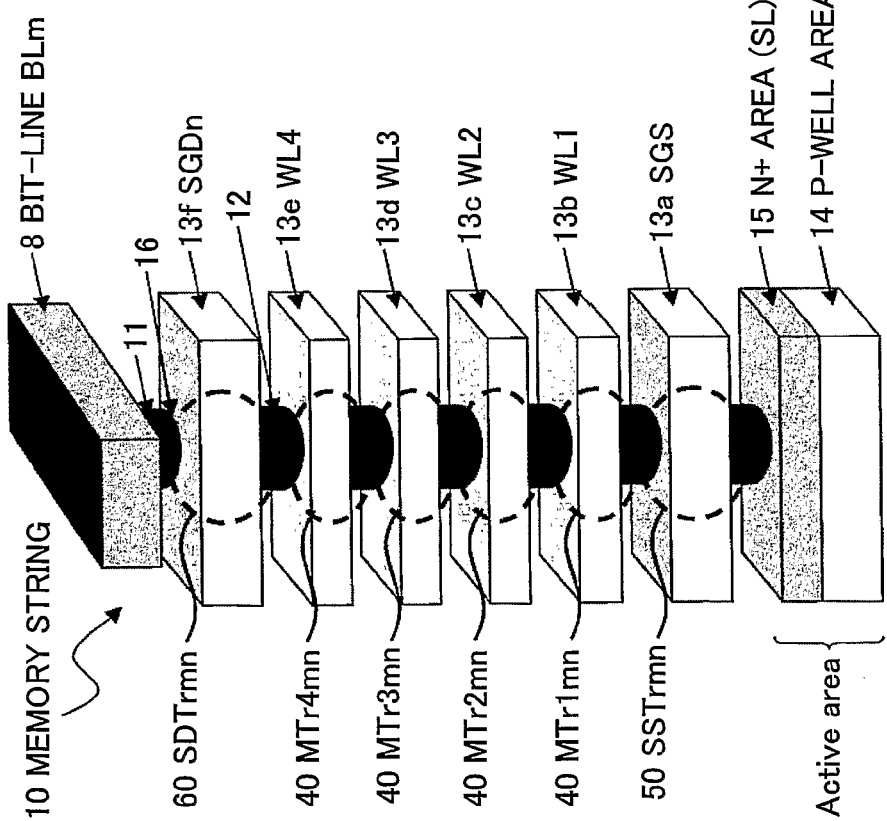

FIG. 3A shows a schematic structure of one memory string 10 (here, the mn-th memory string) of the non-volatile semiconductor memory device 1 according to the first embodiment of the present invention. FIG. 3 is the equivalent circuit diagram. The memory string 10 includes four memory transistors MTr1$mn$ 40 to MTr4$mn$ 40 and two select transistors SSTrmn 50 and SDTrmn 60. The four memory transistors are connected in series, so are the two select transistors. In one memory string 10, the semiconductor substrate has a p type area (p-well area) 14 formed thereon. The p type area has an n+ area 15 formed thereon. The n+ area 15 has a columnar semiconductor 11 formed thereon. The columnar semiconductor 11 has an insulating layer 12 formed therearound. The insulating layer 12 has a plurality of plate electrodes 13$a$ to 13$f$ formed therearound. The electrodes 13$a$ to 13$f$, the insulating layer 12, and the columnar semiconductor 11 together provide the memory transistors MTr1$mn$ 40 to MTr4$mn$ 40, the selection transistor SSTrmn 50, and the selection transistor SDTrmn 60. The electrodes 13$b$ to 13$e$ correspond to the word-lines WL1 to WL4 (7), respectively. The electrode 13$f$ corresponds to the select gate line SGDn. The electrode 13$a$ corresponds to the select gate line SGS. The select transistor SDTrmn 60 has source/drain electrodes. A bit-line BLm is connected to one of them. The select transistor SSTrmn 50 has source/drain electrodes. A source line SL (the n+ area 15 in this embodiment) 70 is connected to one of them. Although this embodiment shows one memory string 10 having four memory transistors MTr connected in series, the present invention is not limited thereto. Any number of memory transistors MTr necessary may be determined.

A description is now given of the operation of the non-volatile semiconductor memory device according to the first embodiment of the present invention having the above structure.

(Read Operation)

Figure 4:
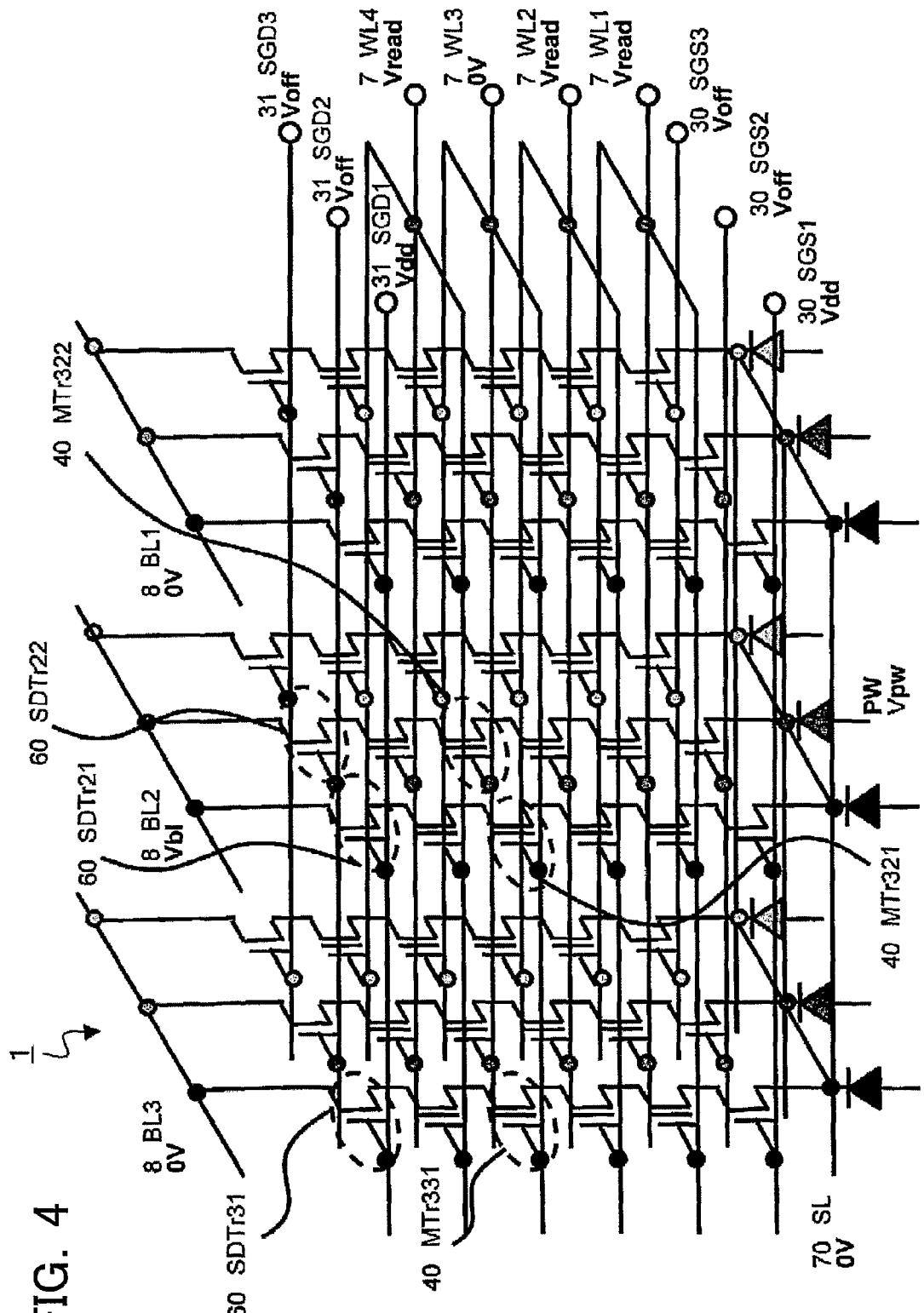
FIG. 4 shows a bias condition when reading data of the memory transistor MTr3 shown in the dotted line in a non-volatile semiconductor memory device 1 according to the first embodiment of the present invention.

FIG. 4 shows a bias condition when reading data of the memory transistor MTr321 (40) shown in the dotted line in the non-volatile semiconductor memory device 1 according to the first embodiment of the present invention. The memory transistor MTr in this embodiment is a so-called MONOS type vertical transistor. It is assumed here that when no electrons are accumulated in the charge accumulation layer, the memory transistor MTr has a threshold voltage Vth (neutral threshold) around 0 V.

In reading data from the memory transistor MTr321 (40), voltages are applied to the lines and areas as follows. The bit-line BL2 (8) is applied with a voltage Vbl (for example 0.7 V). The other bit-lines BL 8 are applied with 0 V. The source line SL 70 is applied with 0 V. The select gate lines SGD1 (31) and SGS1 (30) are applied with a voltage Vdd (for example 3.0 V). The other select gate lines SGD 31 and SGS 30 are applied with a voltage Voff (for example 0 V). The p-well area 14 is applied with a voltage Vpw (for example 0 V, the Vpw may be any potential that does not allow the p-well area 14 or the memory string 10 to be forward biased). The word-line WL3 (7) is then set to 0 V. The other word-lines WL (7) are set to a voltage Vread (for example 4.5 V). The current through the bit-line BL2 (8) may thus be sensed to read data information of the bit (MTr321).

In the non-volatile semiconductor memory device 1 according to the first embodiment, even when the word-lines WL1 to WL4 (7) are driven at a common potential and the select gate lines SGS1 (30) to SGS3 (30) are driven at a common potential, threshold data of any bit may be read.

(Write Operation)

Figure 5:
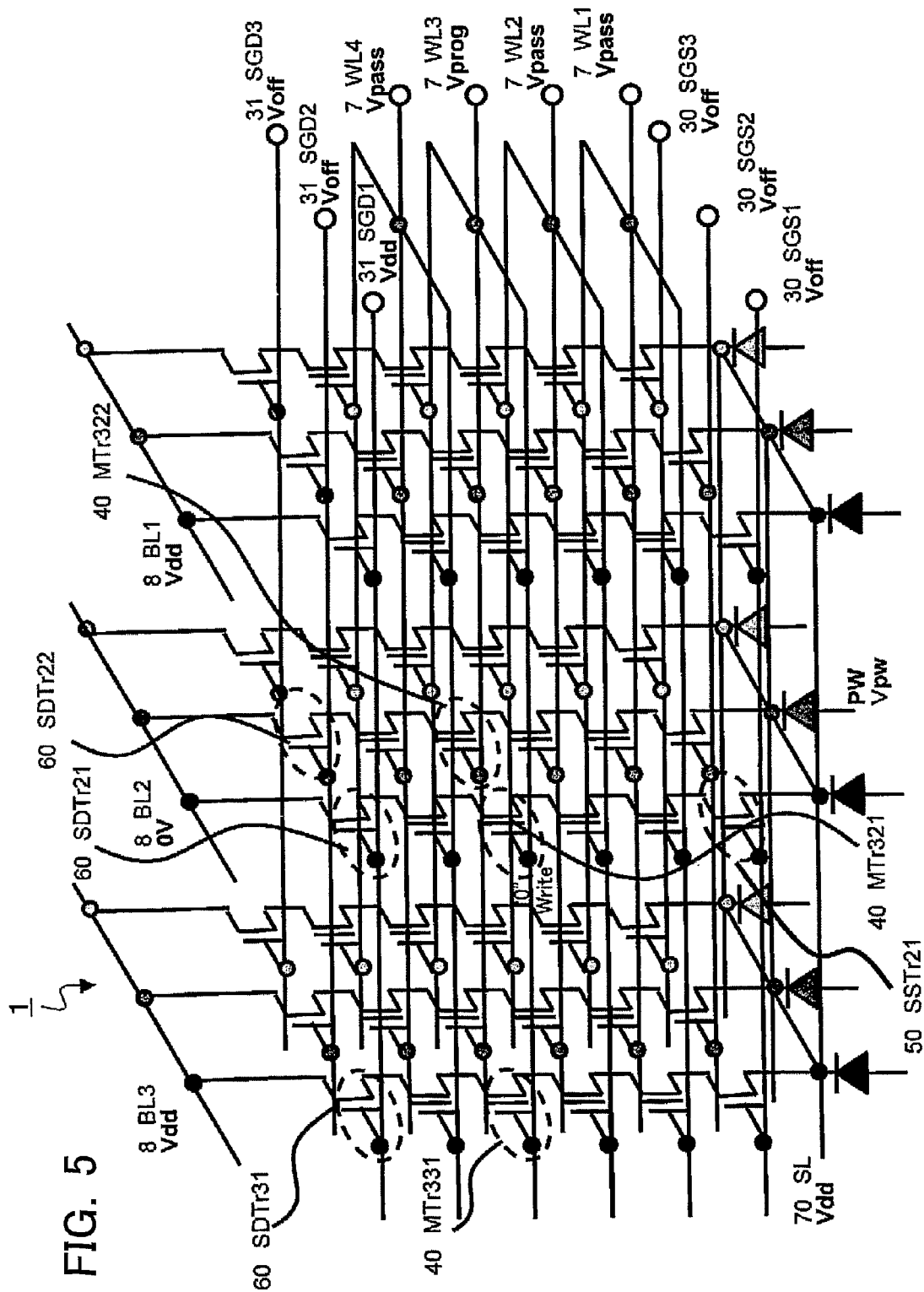
FIG. 5 shows a bias condition when writing data of the memory transistor MTr3 shown in the dotted line in a non-volatile semiconductor memory device 1 according to the first embodiment of the present invention.

FIG. 5 shows a bias condition when writing data of the memory transistor MTr321 (40) shown in the dotted line in the non-volatile semiconductor memory device 1 according to the first embodiment of the present invention.

In writing data "0" to the memory transistor MTr321 (40), voltages are applied to the lines and areas as follows. The bit-line BL2 (8) is applied with 0 V. The other bit-lines BL 8 are applied with Vdd. The source line SL 70 is applied with a voltage Vdd. The select gate line SGD1 (31) is applied with a voltage Vdd. The other select gate lines SGD 31 are applied with a voltage Voff. The select gate lines SGS1 (30) to SGS3 (30) are applied with a voltage Voff. The p-well area 14 is applied with a Vpw (for example 0 V). The word-line WL3 (7) is set to Vprog (for example 18V). The other word-lines WL (7) are set to Vpass (for example 10V). Electrons are thus injected into the charge accumulation layer, shifting the threshold voltage of the memory transistor MTr321 (40) in the positive direction.

In writing data "1" to the memory transistor MTr321 (40), specifically, in injecting no electrons into the charge accumulation layer, the bit-line BL2 (8) is applied with a voltage Vdd. The select transistor SDTr21 (60) thus turns off, injecting no electrons into the charge accumulation layer of the memory transistor MTr321 (40).

Each bit-line BL 8 may be appropriately set to a potential of 0 V or Vdd, allowing page write.

(Erase Operation)

Figure 6:
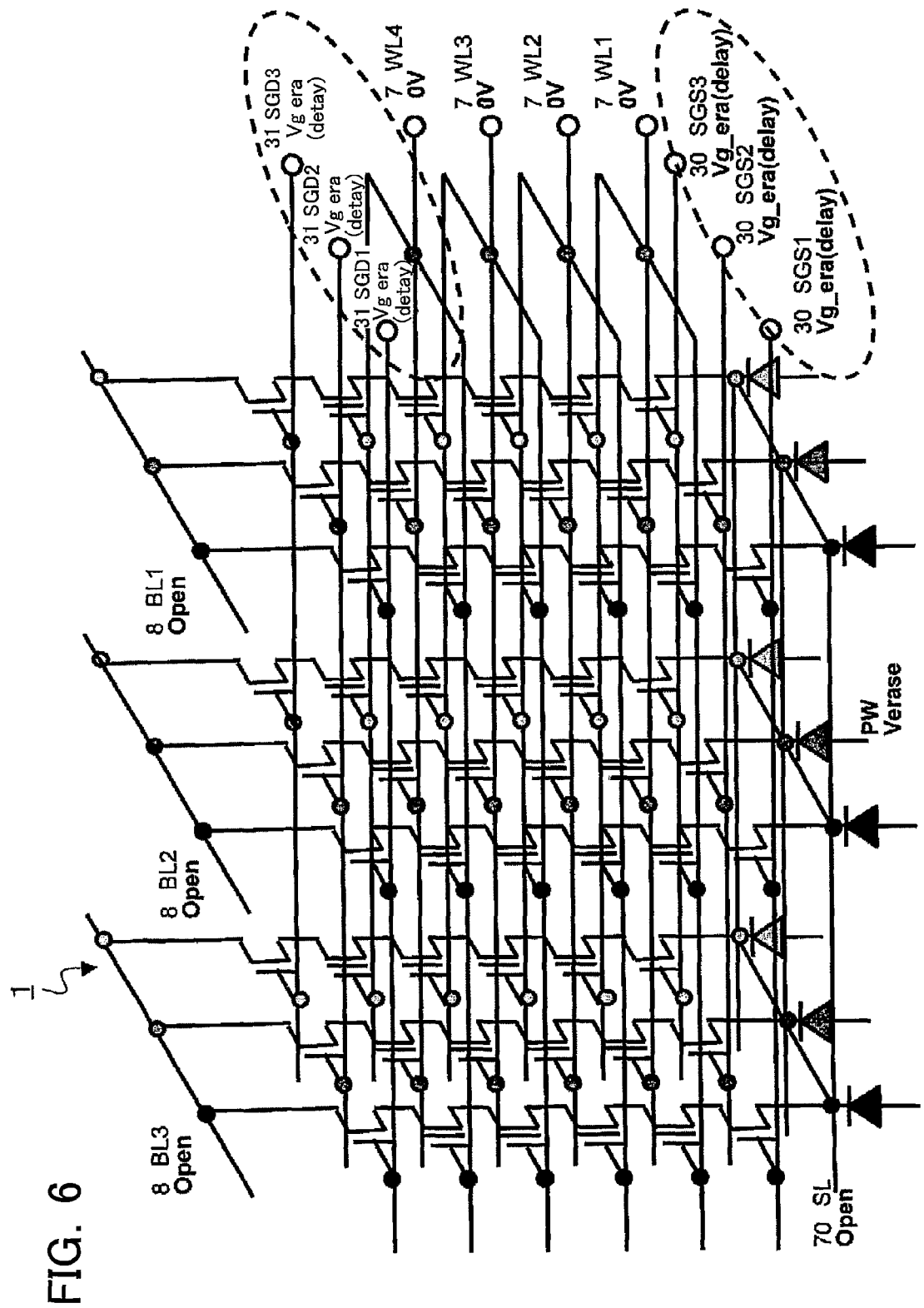
FIG. 6 shows a bias condition of a selected block when erasing data of the memory transistor MTr in the selected block in a non-volatile semiconductor memory device 1 according to the first embodiment of the present invention.
Figure 7:
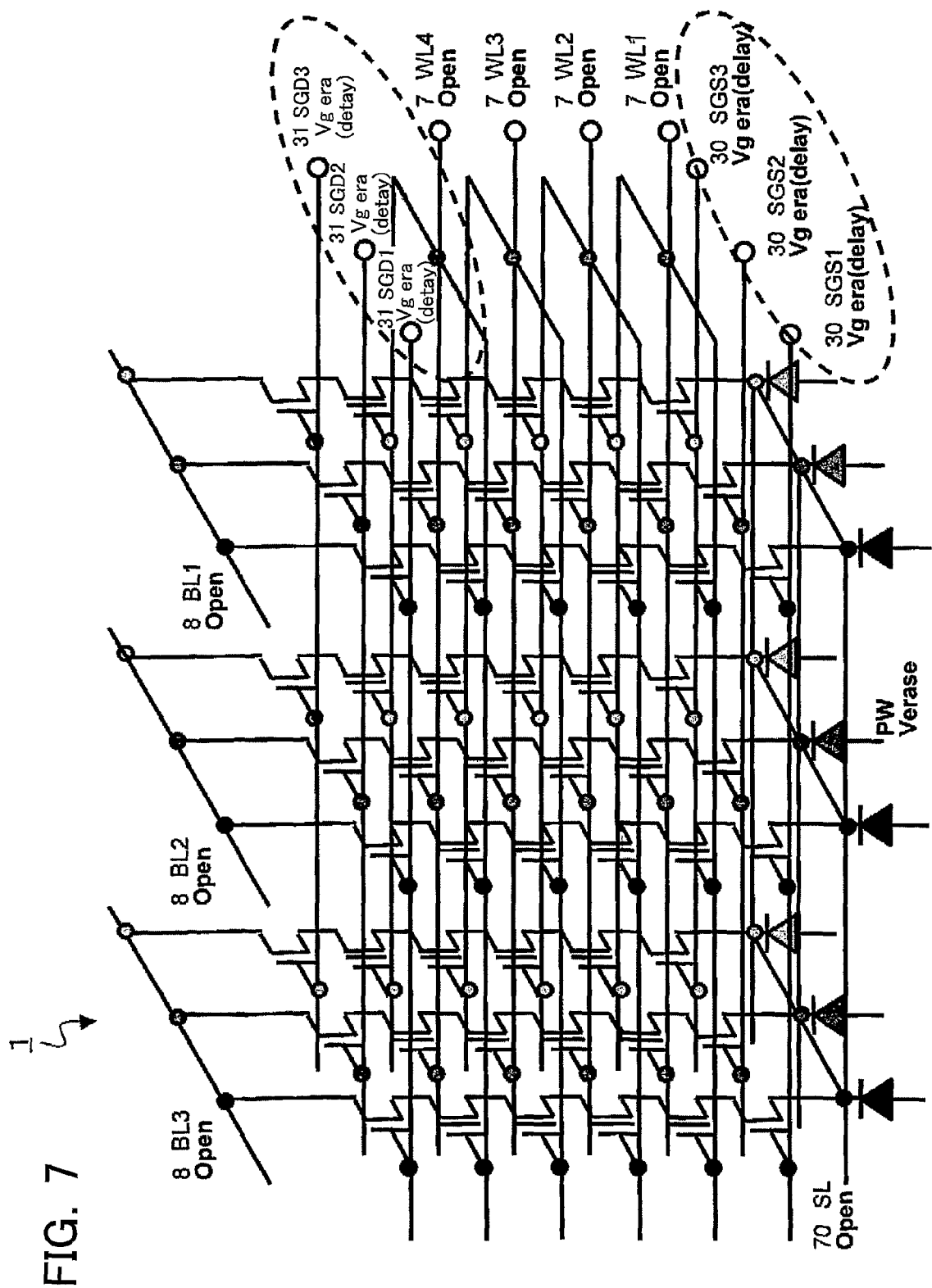
FIG. 7 shows a bias condition of an unselected block when erasing data of the memory transistor MTr in a selected block in a non-volatile semiconductor memory device 1 according to the first embodiment of the present invention.

Data is erased in units of a block of a plurality of memory strings. FIG. 6 shows a bias condition of a selected block when erasing data of the memory transistor MTr in the selected block in the non-volatile semiconductor memory device 1 according to the first embodiment of the present invention. FIG. 7 shows a bias condition of an unselected block when erasing data in the non-volatile semiconductor memory device 1 according to the first embodiment of the present invention.

With reference to FIG. 6, in the selected block (the block to erase), voltages are applied to the lines and areas as follows. The p-well area 14 is applied with Verase (for example 20V). The source line SL 70 is electrically floated. The select gate lines SGS 30 and SGD 31 are increased in potential (for example by 15 V) with a slight time shift (for example about 4 [micron] sec shift) from when the p-well area 14 is applied with Verase. A potential close to Verase is thus transferred in the channel-forming area (body portion) of the memory transistor MTr. When, therefore, the word-lines WL1 to WL4 (7) are set to, for example, 0 V, electrons of the charge accumulation layer of the memory transistor MTr are pulled to the p-well, thereby erasing data.

With reference to FIG. 7, in the unselected blocks, the word-lines WL1 to WL4 (7) are electrically floated. The word-lines WL1 to WL4 (7) are thus increased in potential by coupling. No potential difference thus occurs between the word-lines WL1 to WL4 (7) and the charge accumulation layers of the memory transistors MTr1 to MTr4, respectively. No electrons are therefore pulled (erased) from the charge accumulation layers.

The following Table 1 summarizes the relationship between the potentials in the "read operation", "write operation," and "erase operation" in the non-volatile semiconductor memory device 1 according to the first embodiment of the present invention.

TABLE 1

|     | Read  | Write "0" | Write "1" | Erase (Select) | Erase (No Select) |
| --- | ----- | --------- | --------- | -------------- | ----------------- |
| BL  | Vbl   | 0         | Vdd       | Verase         | Verase            |
| SGD | Vdd   | Vdd       | Vdd       | Vera del       | Vera del          |
| WL4 | Vread | Vpass     | Vpass     | 0              | open              |
| WL3 | 0     | Vprog     | Vprog     | 0              | open              |
| WL2 | Vread | Vpass     | Vpass     | 0              | open              |
| WL1 | Vread | Vpass     | Vpass     | 0              | open              |
| SGS | Vdd   | Voff      | Voff      | Vera del       | Vera del          |
| SL  | 0     | Vdd       | Vdd       | open           | open              |
| PW  | 0     | 0         | 0         | Verase         | Verase            |

(Manufacturing Method)

The read and write operations are done by memory cell layers. The layers are three-dimensionally laminated in the non-volatile semiconductor memory device. In the memory device, a memory cell area includes the three-dimensionally laminated memory cell layers. Each memory cell layer includes an amorphous silicon film (or polysilicon film) on which a plurality of memory cells are formed. The amorphous silicon film (or polysilicon film) works as the word-line electrode of a two-dimensional plate structure. The word-line driver circuits or the like are connected to the respective amorphous silicon films, which provide the word-line electrodes. The connection is made via contact holes formed on the respective amorphous silicon films three-dimensionally. Forming the contact holes may have the following problems. First, the contact holes are formed on the respective ends of the memory cell layers. The cell layers should thus be fabricated to prevent the ends from being overlapped in the vertical direction. Second, the contact holes may have different heights (depths) depending on the number of laminated memory cell layers. It is thus hard to form the contact holes in the same fabrication process. They may need to be formed in separate fabrication processes.

With reference to FIG. 1, the non-volatile semiconductor memory device 1 includes four laminated memory cell layers. Correspondingly, the device 1 includes four laminated amorphous silicon films as the word-line electrodes. It is not simple to form, by etching, the contact holes vertically in the amorphous silicon films as the word-line electrodes. There are some ideas to form the holes.

By way of example, the amorphous silicon films as the word-line electrodes may be formed to have different lengths in the direction perpendicular to the bit-lines. The ends of the films in the direction perpendicular to the bit-lines may thus be nonoverlapped. Specifically, the amorphous silicon films may be formed as follows. The amorphous silicon film for the bottom word-line electrode has the greatest length. The second bottom amorphous silicon film has the second greatest length. The third bottom amorphous silicon film has the third greatest length. The top amorphous silicon film has the shortest length. When thus formed, the ends of the amorphous silicon films as the word-line electrodes are arranged in a pyramid shape and are not overlapped. The vertical contact holes may thus be formed only on the target word-lines. Such fabrication is hereinafter referred to as pyramid fabrication.

Note that the pyramid fabrication requires repetition of photoresist slimming and reactive ion etching (RIE).

The contact holes may have different heights (depths) for each of the amorphous silicon films as the word-line electrodes. So, depending on the number of laminated memory cell layers, it may be difficult for the pyramid fabrication to collectively form the contact holes. The solutions may include a deposition of a considerably thick stopper film, and an ultra-high selective ratio etching. The ultra-high selective ratio etching is, however, generally very difficult to perform. The considerably thick stopper film deposition will have two disadvantages as described below. The stopper film is needed for the following reason. The contact holes are formed by PEP and RIE. When a plurality of contacts having different depths are collectively fabricated, the shallowest contact may penetrate the amorphous silicon film for the word-line electrode before the deepest contact is etched off. Preventing this problem needs the etching stopper film. Laminating four memory cell layers, for example, generally needs a stopper film having a thickness from 150 nm to 200 nm. The first disadvantage is thus that a wide contact area should be formed. Specifically, the amorphous silicon films are formed to be arranged in a pyramid shape to prevent them from being overlapped at their contact areas, so the stopper films are also deposited on the steps (i.e., the side walls of the amorphous silicon films). The second disadvantage is that the channel-portion amorphous silicon is increased in resistance, decreasing the current therethrough. Specifically, the thick stopper films between the upper select transistor SDTr layer and the amorphous silicon films as the word-line electrodes increase each distance between the word-line and the upper select transistors SDTr. To avoid these disadvantages, therefore, the contact holes should not be formed collectively, and instead be formed one by one.

In this embodiment, among the laminated word-lines, each word-line other than the top word-line is formed as follows. An end of the word-line is bent upward from (in a direction away from) the substrate and is drawn to a position below the upper select transistor SDTr layer. The end is then bent horizontally to have a plane. The planes of the top word-line's end and each bent-and-drawn word-line's end are in the same plane. In other words, the planes of the top word-line's end and each bent-and-drawn word-line's end are formed at the same height from the substrate surface. Therefore, the top word-line's end and the contact holes formed on the planes are at the same depth (height). The contact holes serve to connect the word-lines and the upper layer metal wiring. The thick stopper film or the ultra-high selective-ratio etching is thus not necessary. Consequently, the contact holes for the respective word-lines may thus be collectively formed by the same etching process. Thus, first, the non-volatile semiconductor memory device 1 according to the first embodiment of the present invention may restrict the increase in the number of fabrication processes, facilitating the fabrication of the device. Second, the non-volatile semiconductor memory device 1 according to the first embodiment of the present invention may eliminate a wide contact area. This is because the stopper films are not deposited on the side walls of the steps unlike the pyramid fabrication. Third, the non-volatile semiconductor memory device 1 according to the first embodiment of the present invention may prevent increase in each distance between the word-lines and the upper select transistor SDTr, preventing increase in resistance of each connection between the upper select transistor SDTr layer and the memory cell layer channels. This is because each contact hole has the same height, eliminating the thick stopper film.

Figure 8:
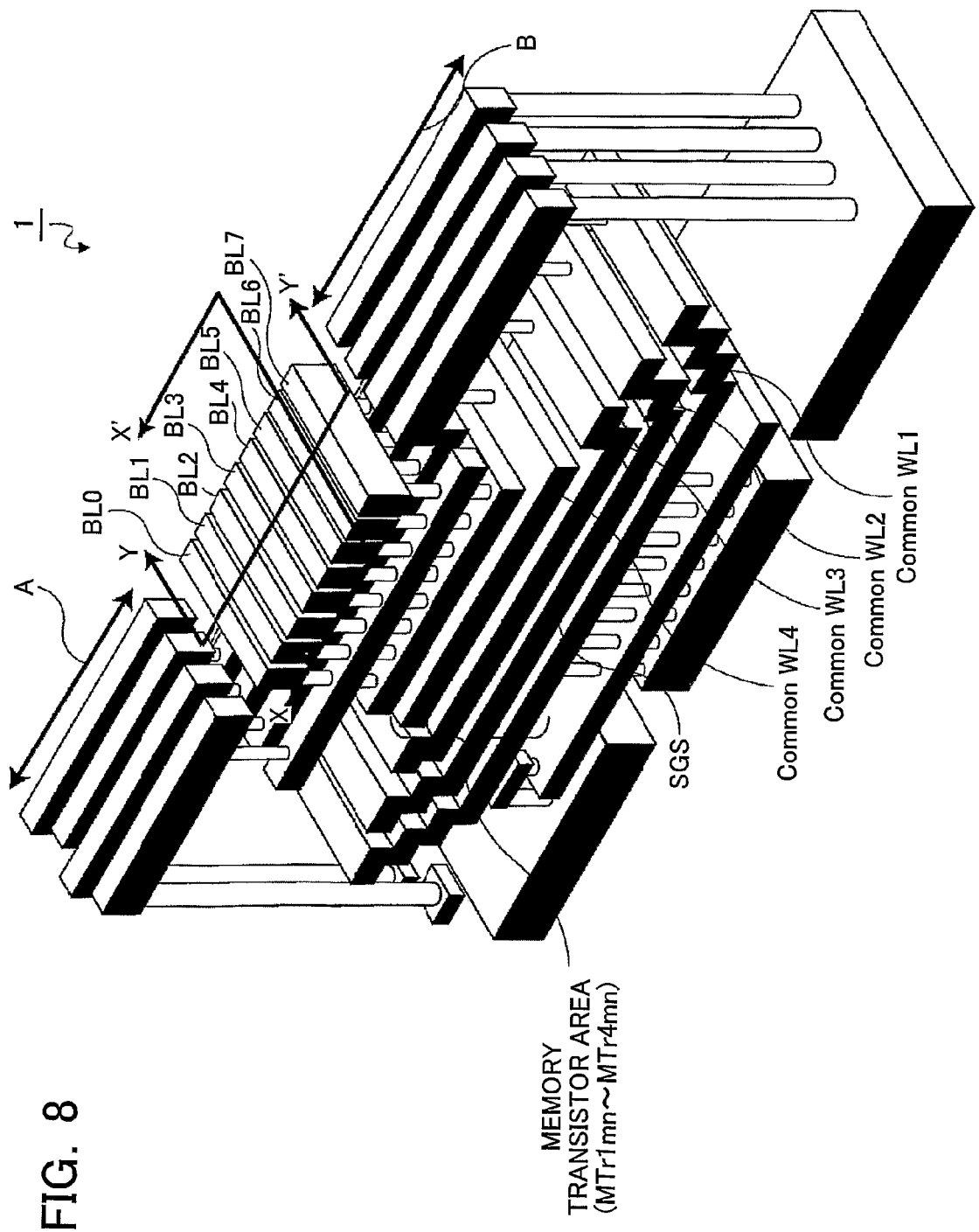
FIG. 8 shows a bird's eye view of a non-volatile semiconductor memory device 1 according to the first embodiment of the present invention.

FIG. 8 shows a bird's eye view of the non-volatile semiconductor memory device 1 according to the first embodiment of the present invention. The non-volatile semiconductor memory device 1 according to the first embodiment of the present invention includes a semiconductor substrate on which memory transistors are formed. With reference to FIGS. 1 and 8, the word-lines WL1 to WL4 (7) each extends two-dimensionally in an area (memory transistor area 2) where the memory cells are formed. Among the word-lines WL1 to WL4 (7), in the word-lines WL1 to WL3 (7) other than the top word-line WL4 (7), at least an end in a direction perpendicular to the bit-line is drawn to a position below the upper select transistor SDTr layer, and is then bent generally horizontally to have a plane. Each of the word-lines WL1 to WL3 (7) is drawn upward by being bent several times to form a stepped structure. Each of the word-lines WL1 to WL3 (7) thus has, at its one end, a side wall rising from the substrate. In other words, each of the amorphous silicon films (or polysilicon films) for the word-line electrodes forms a stepped structure extending upward. The stepped structure alternately and continuously has a plane generally horizontal to the substrate and a side wall rising from the substrate. Each film is also formed to have a plane at its end. Each plane is formed to be in the same plane, in other words at the same height from the substrate. The height is the same as that of the top word-line WL4 (7). In the non-volatile semiconductor memory device 1 according to an embodiment of the present invention, the contacts are formed on the end of the word-line WL4 (7) and the planes of the word-lines WL1 to WL3 (7). The contacts serve to connect each of the word-lines WL1 to WL4 (7) and the word-line driver circuit 3. Note that each area where the contact is formed is hereinafter referred to as the contact area. The contact areas are provided on the end of the word-line WL4 (7) and the planes, which are formed at the same height. The same photo-etching process may thus be used to fabricate the contact holes to connect the word-line driver circuit 3 and each of the word-lines WL1 to WL4 (7). The bit-line BL8 connects to the sense amplifier 6. The select gate line SGD 31 connects to the select gate line SGD driver circuit 5. Note that hereinafter, the word-lines WL1 to WL3 (7) may be referred to as the first word-line, and the word-line WL4 (7) may be referred to as the second word-line.

As described above, the memory cells are formed two-dimensionally (i.e., formed in a plane) in a layer (memory cell layer), and each of the word-lines WL1 to WL4 (7) is formed in the respective memory cell layer by a common electrically conductive layer. The number of word-line driver circuits 3 may thus be drastically decreased, reducing the chip area.

With reference to FIGS. 9 to 32, a process of making the non-volatile semiconductor memory device according to the first embodiment of the present invention will be described. In FIGS. 9 to 16 and 32, the left side shows a periphery circuit area where the periphery circuits such as the source line select gate line driver circuit 4 and the drain select gate line driver circuit 5 are formed, and the right side shows the memory transistor area. FIGS. 17 to 31 show only the memory transistor areas. Note that in any of the figures, the memory transistor area shows portions corresponding to the area A, the area B, or the cross-sectional view taken along the X-X' and Y-Y' of the non-volatile semiconductor memory device 1 according to the first embodiment of the present invention shown in FIG. 8.

Figure 9:
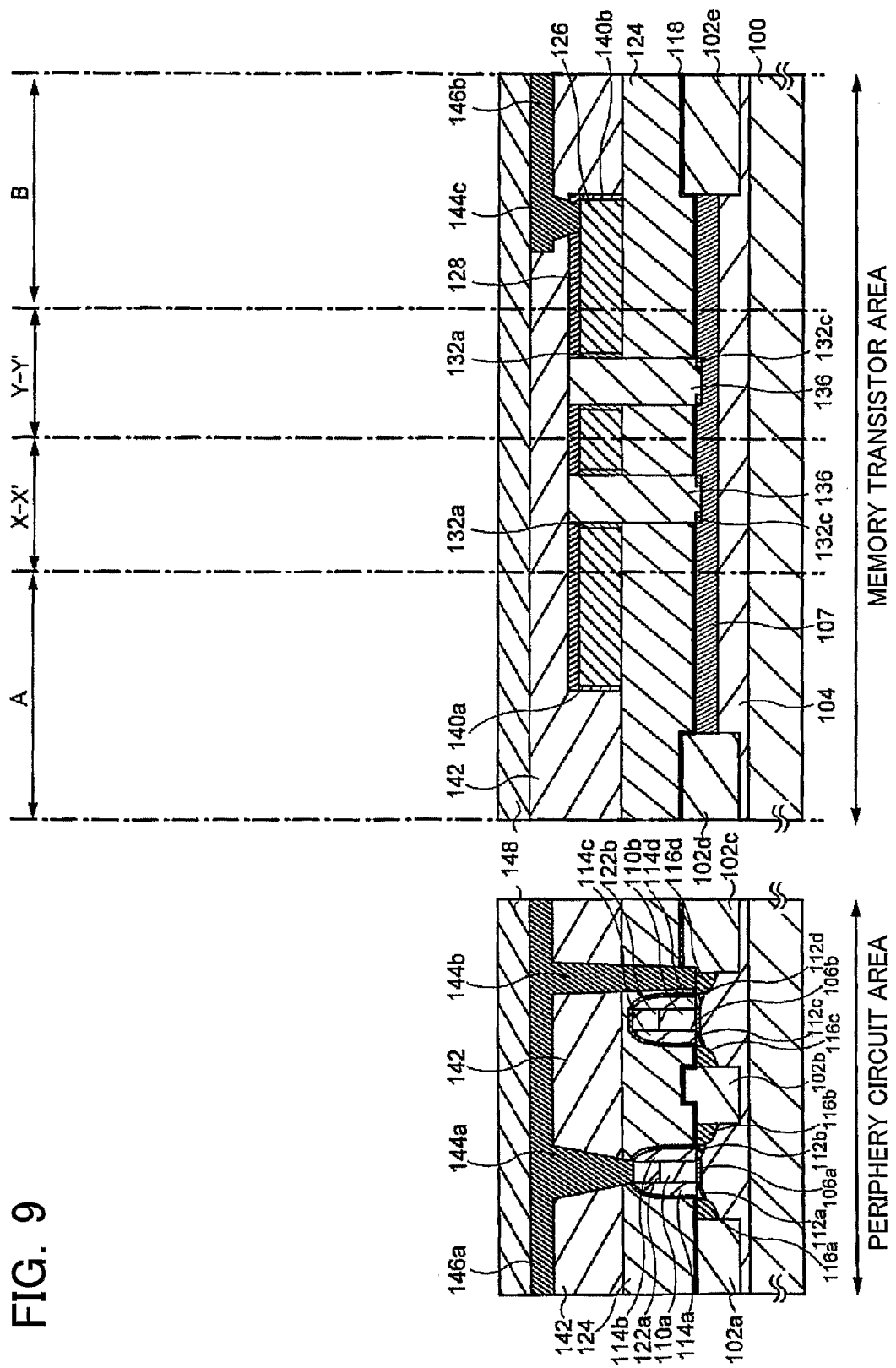
FIG. 9 illustrates a process of making a non-volatile semiconductor memory device 1 according to the first embodiment of the present invention.

First, with reference to FIG. 9, a method of making the lower selection transistor SSTr layer is described. Device isolation areas STI 102a, STI 102b, STI 102c, STI 102d, and STI 102e are formed on the semiconductor substrate 100. Boron (B) ions are then implanted to form a p-well area 104. Boron (B) ions are additionally implanted near the surface of the substrate 100 to form channel implanted areas 106a and 106b. The channel implanted areas serve to adjust the threshold Vth of the transistors. Only the memory cell transistor area is then implanted with, for example, phosphorus (P) ions to form an n+ diffusion area 107. The diffusion area 107 works as a source line SL. A first gate-insulating layer (not shown) is formed. A desired photoresist mask is then formed and the substrate is wet etched to remove a desired portion of the first gate-insulating layer and portions of the device isolation areas STI 102a and STI 102b. The photoresist mask is removed. The second gate-insulating layer (not shown) is formed. A polysilicon (poly-Si) film (not shown) added with an impurity such as phosphorus (P) is then formed. The polysilicon film is etched to form transistor gate electrodes 110a and 110b in the periphery circuit area. The n-channel transistor areas in the periphery circuit area are implanted with impurities such as phosphorus (P) ions or arsenic (As) ions to form n-type areas 112a, 112b, 112c, and 112d. A silicon nitride film is deposited over the entire substrate. The silicon nitride film is then anisotropically etched to form sidewalls 114a, 114b, 114c, and 114d. The n-channel transistor areas in the periphery circuit area are implanted with, for example, arsenic (As) ions to form source/drain areas 116a, 116b, 116c, and 116d. The p-channel transistor area in the periphery circuit area is implanted with, for example, boron (B) ions to form a source/drain area (not shown). A silicon nitride film (barrier silicon nitride film) 118 is then formed over the entire substrate. A boron phospho silicate glass (BPSG) film (not shown) is then formed over the entire substrate. The BPSG film is planarized by a CMP process. The silicon nitride film 118 on the gate electrodes is removed to expose the upper portions of the gate electrodes 110a and 110b. A cobalt (Co) film is sputtered over the entire substrate. The Co film is then heated to form cobalt salicide 122a and 122b. A BPSG film 124 is formed as an interlayer dielectric film over the entire substrate by a well-known CVD process. An amorphous silicon film (or polysilicon film) 126 added with an impurity such as phosphorus (P) is deposited over the entire substrate. The film 126 serves as the select gate line SGS in the memory transistor area. A silicon nitride film 128 is then formed. A photoresist process is performed to form a hole (which may hereinafter be referred to as a "transistor plug hole"). The substrate is heated to form a thermally-oxidized film 132a (the first gate-insulating layer). The film 132a serves as a gate-insulating layer of the lower selection transistor SSTr. A block silicon nitride film (not shown) is formed. Well-known wet etching or dry etching then removes a portion of the thermally-oxidized film on the hole bottom to form a thermally-oxidized film 132c. The block silicon nitride film is then removed. An amorphous silicon (a—Si) film is formed over the entire substrate. The amorphous silicon film is then, for example, CMP processed to form a columnar amorphous silicon layer (the first columnar semiconductor) 136. The memory transistor area is fabricated by PEP. A titanium (Ti) film is formed and heated to form titanium silicide (TiSi) 140a and 140b. Cobalt silicide (CoSi↓2↓) may also be formed. A deposition process such as a well-known CVD process forms a BPSG film 142 over the entire substrate as an interlayer dielectric film. The BPSG film 142 is then planarized by a CMP process. A photo-etching process then forms a contact hole. An wiring groove is then formed and a tungsten (W) film is embedded in it. The tungsten film is CMP processed to form tungsten (W) plugs 144a, 144b, and 144c, and wirings 146a and 146b. A TEOS film 148 is then formed (FIG. 9). The above processes form the lower selection transistor SSTr layer.

Figure 10:
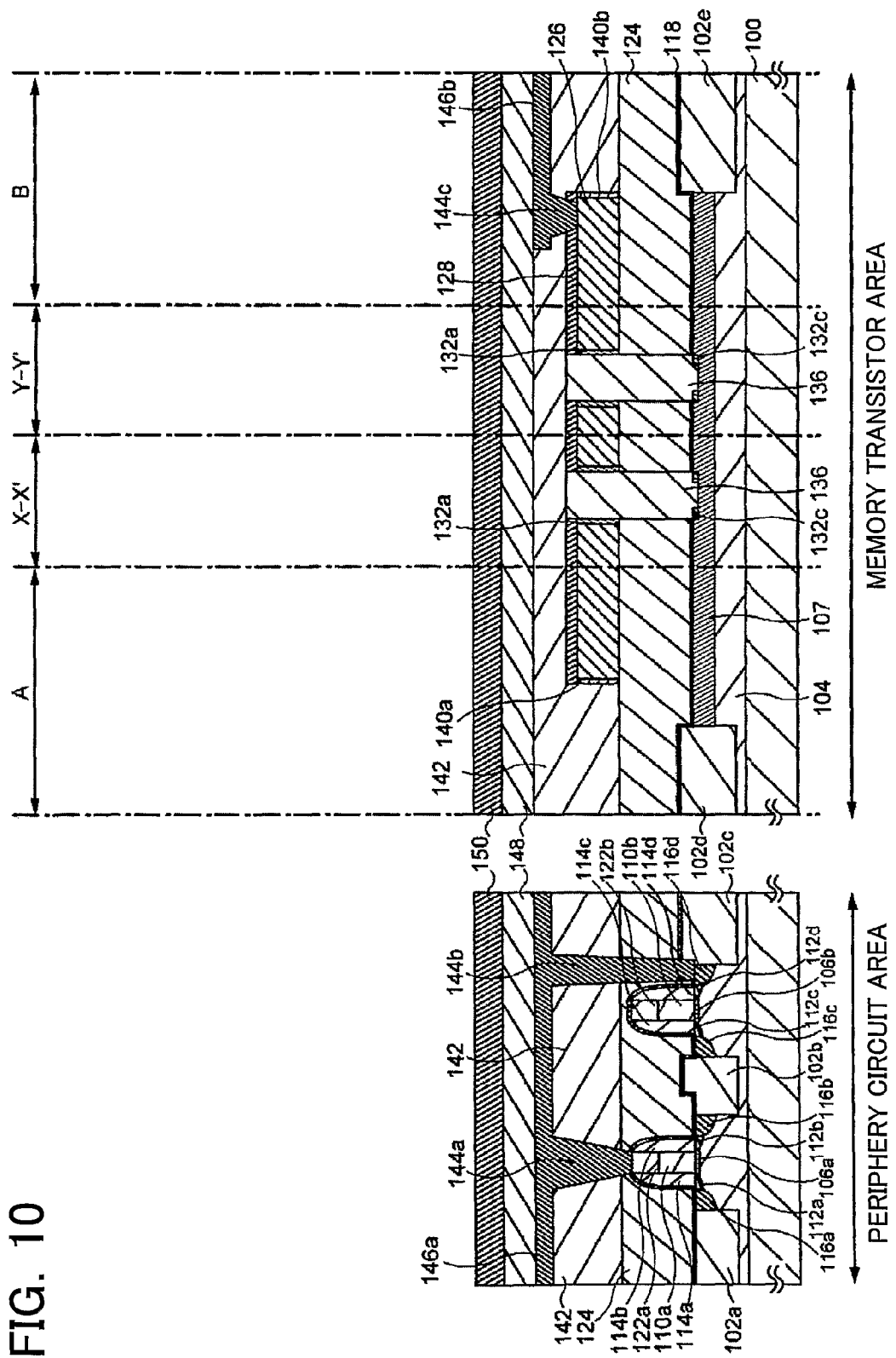
FIG. 10 illustrates a process of making a non-volatile semiconductor memory device 1 according to the first embodiment of the present invention.
Figure 11:
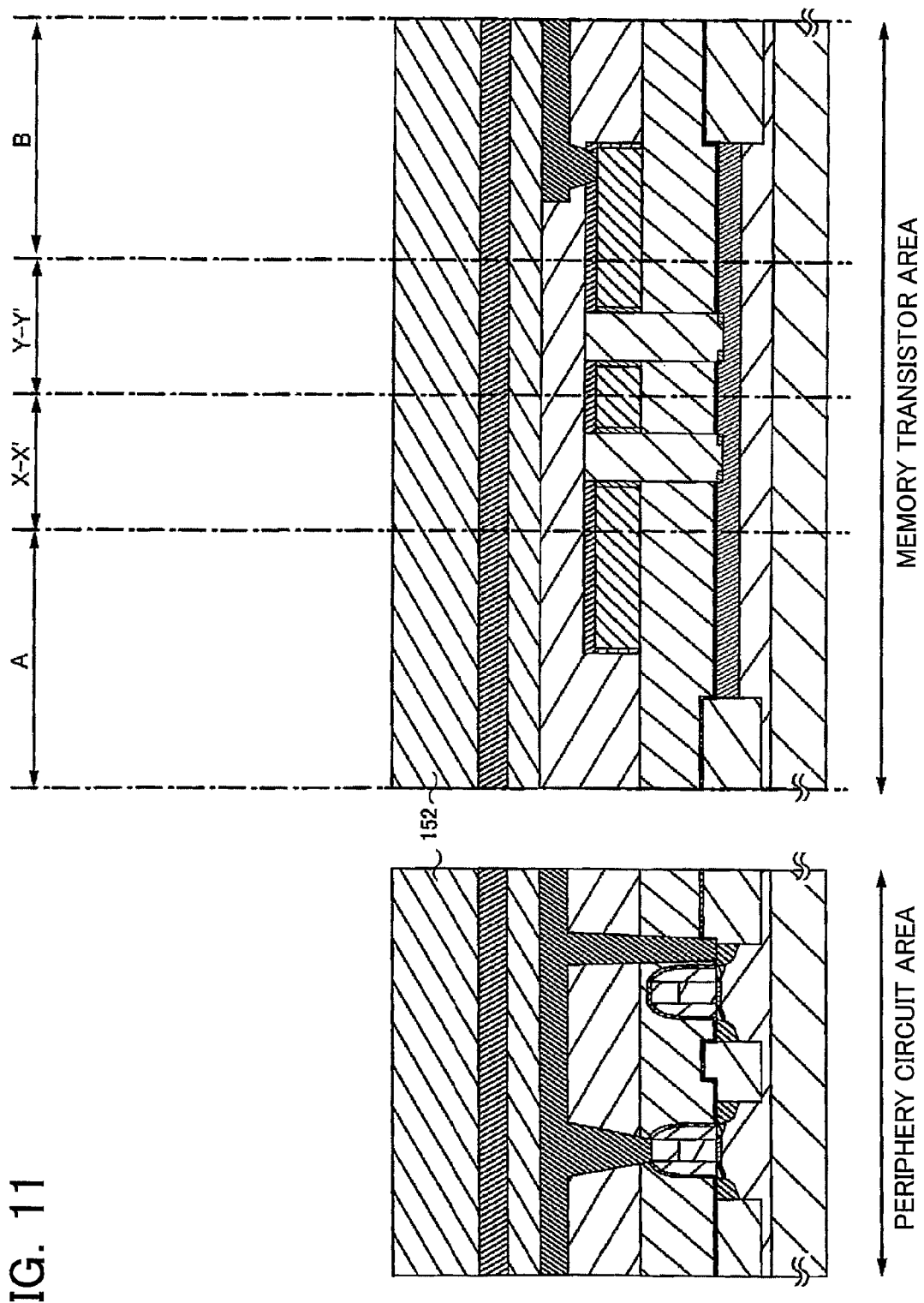
FIG. 11 illustrates a process of making a non-volatile semiconductor memory device 1 according to the first embodiment of the present invention.

A method of making the memory cell layer and the upper select transistor SDTr layer is now described. After the silicon dioxide film 148 is formed, a silicon nitride film 150 is deposited as the etching stopper film (FIG. 10). CVD or plasma CVD then deposits a silicon dioxide film 152 as an interlayer dielectric film (FIG. 11).

Figure 12:
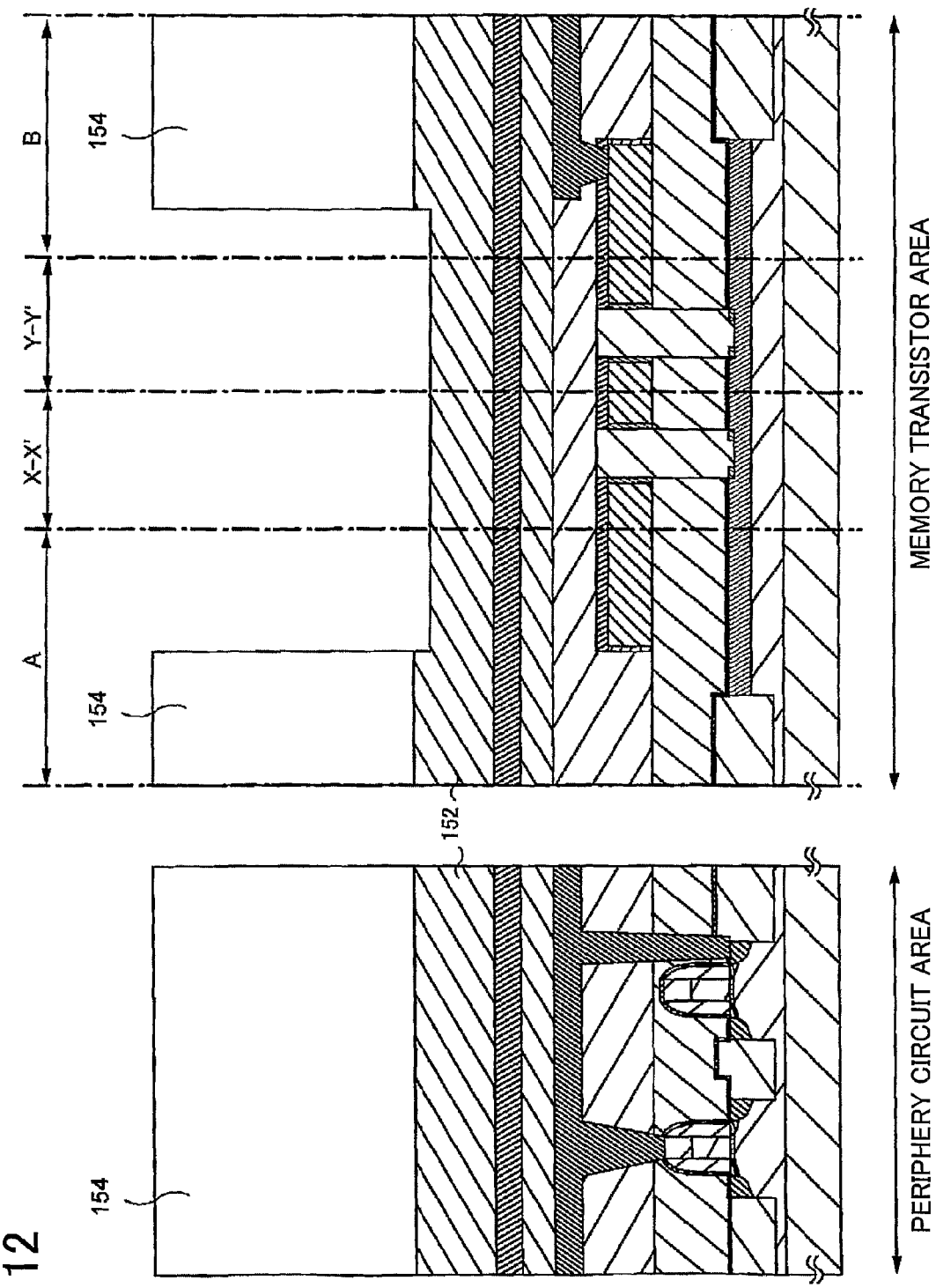
FIG. 12 illustrates a process of making a non-volatile semiconductor memory device 1 according to the first embodiment of the present invention.
Figure 13:
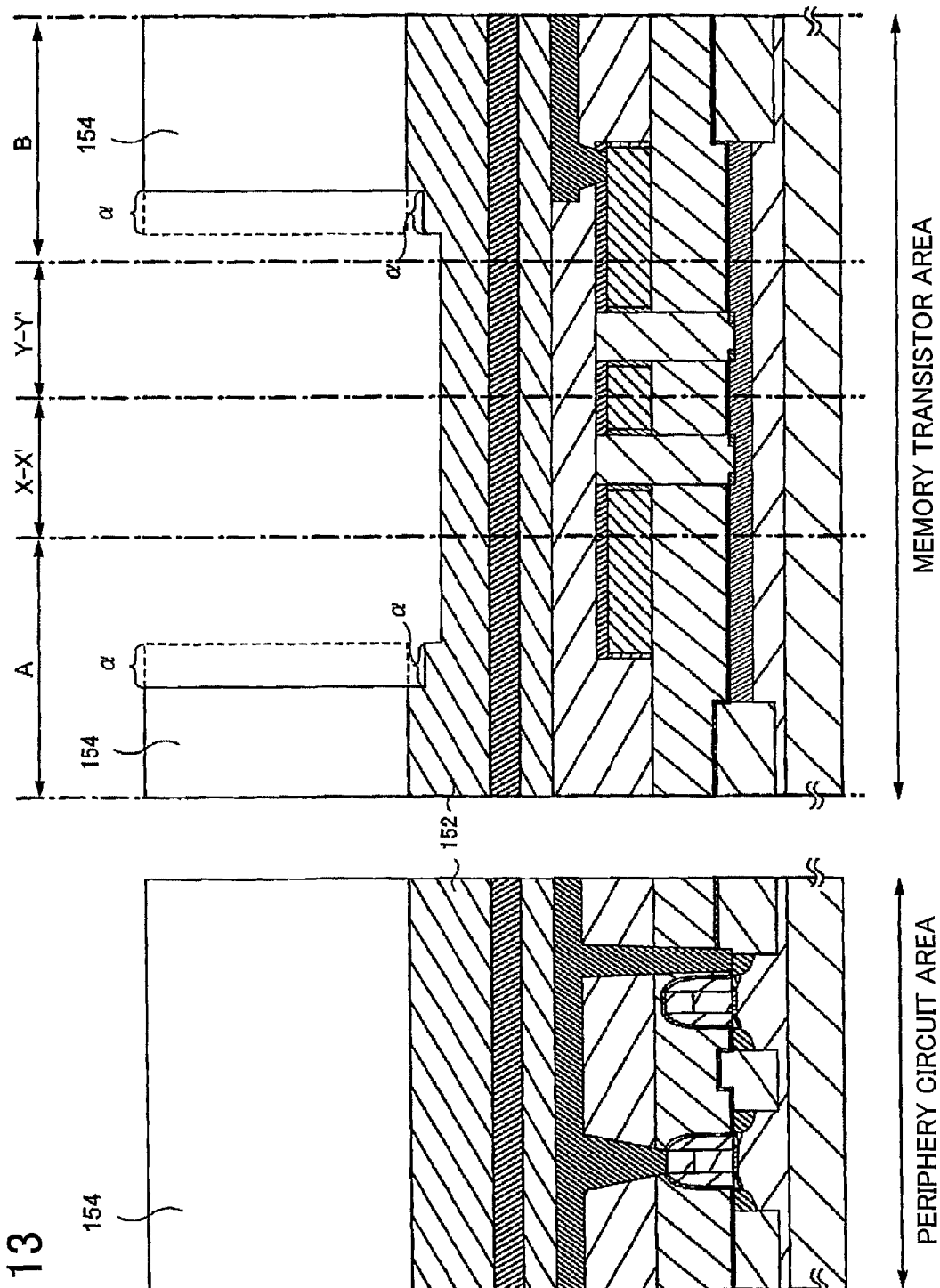
FIG. 13 illustrates a process of making a non-volatile semiconductor memory device 1 according to the first embodiment of the present invention.

A photoresist 154 is then formed over the entire substrate. The photoresist is patterned by lithography to open, in the memory transistor area in FIG. 8, a portion of the area A, an area (hereinafter referred to as a memory area) where the memory transistors are formed, and a portion of the area B. Using the patterned photoresist 154, the silicon dioxide film 152 is anisotropically (vertically) dry etched (FIG. 12). The photoresist 154 is slightly and isotropically etched to reduce it by a predetermined width [alpha]. The process to reduce the photoresist 154 is hereinafter referred to as a resist slimming. Using the slimed photoresist 154 as a mask, the silicon dioxide film 152 is anisotropically (vertically) dry-etched again (FIG. 13). The resist slimming makes the width of the photoresist 154 less than that in the previous dry etching. In other words, the photoresist 154 has a wider opening. A wider area of the silicon dioxide film 152 will thus be etched. This process and the previous dry etching etch the silicon dioxide film 152 in two stages. The etched area thus has a stepped surface at both ends. A width of the stepped surface that is perpendicular to the bit-line direction is the same as the width [alpha] (the first width) after the resist slimming.

Figure 14:
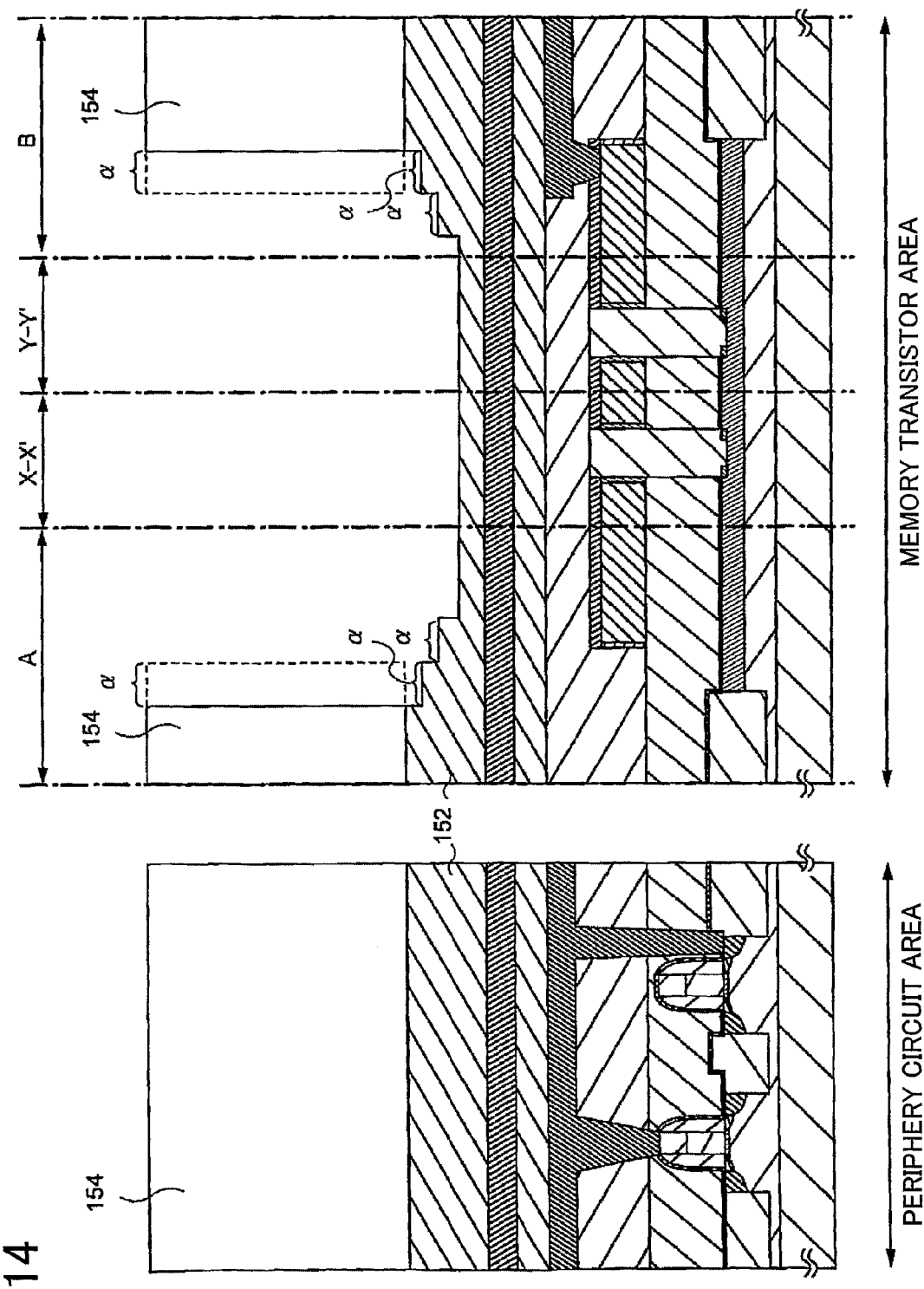
FIG. 14 illustrates a process of making a non-volatile semiconductor memory device 1 according to the first embodiment of the present invention.
Figure 15:
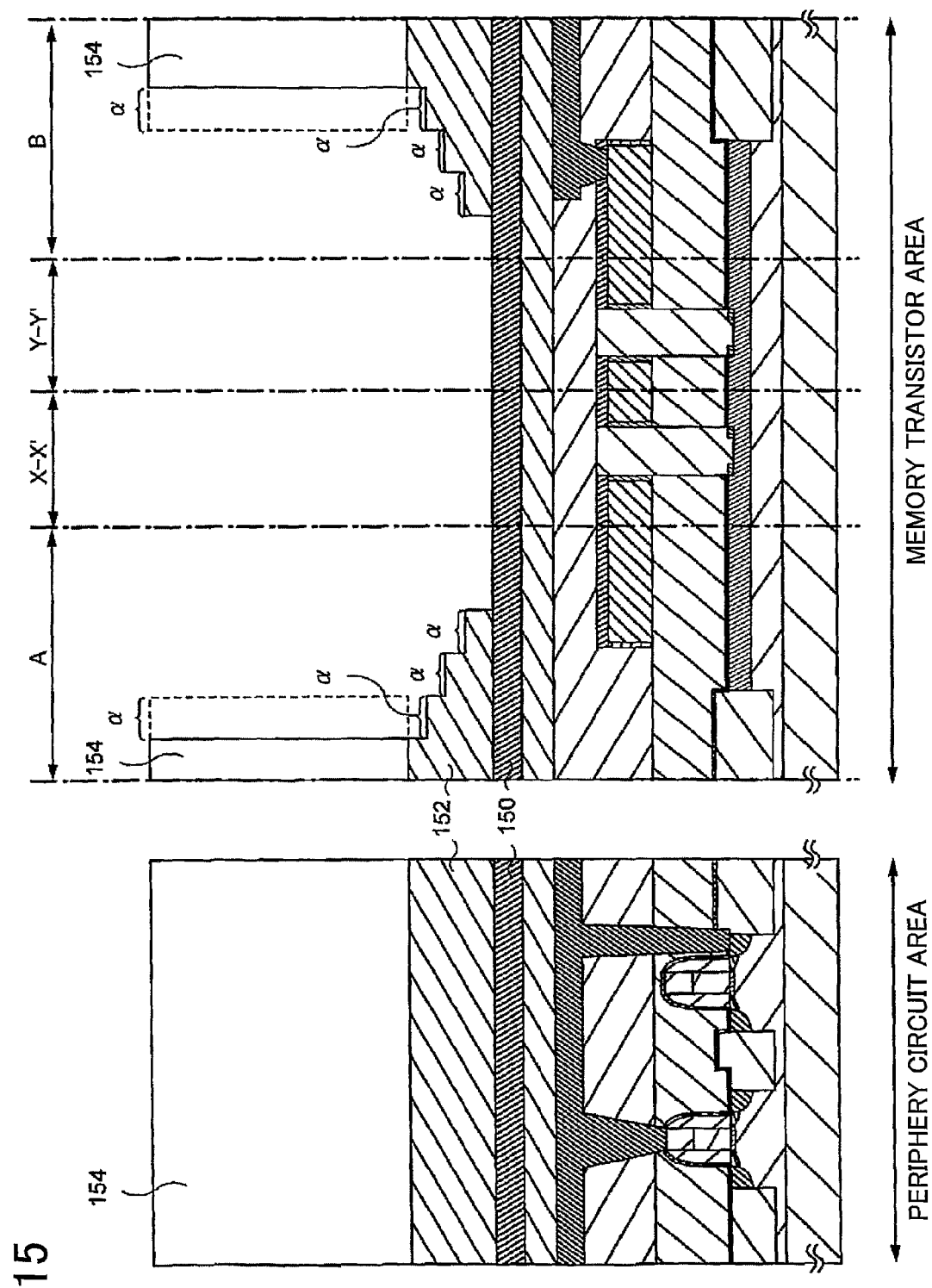
FIG. 15 illustrates a process of making a non-volatile semiconductor memory device 1 according to the first embodiment of the present invention.
Figure 16:
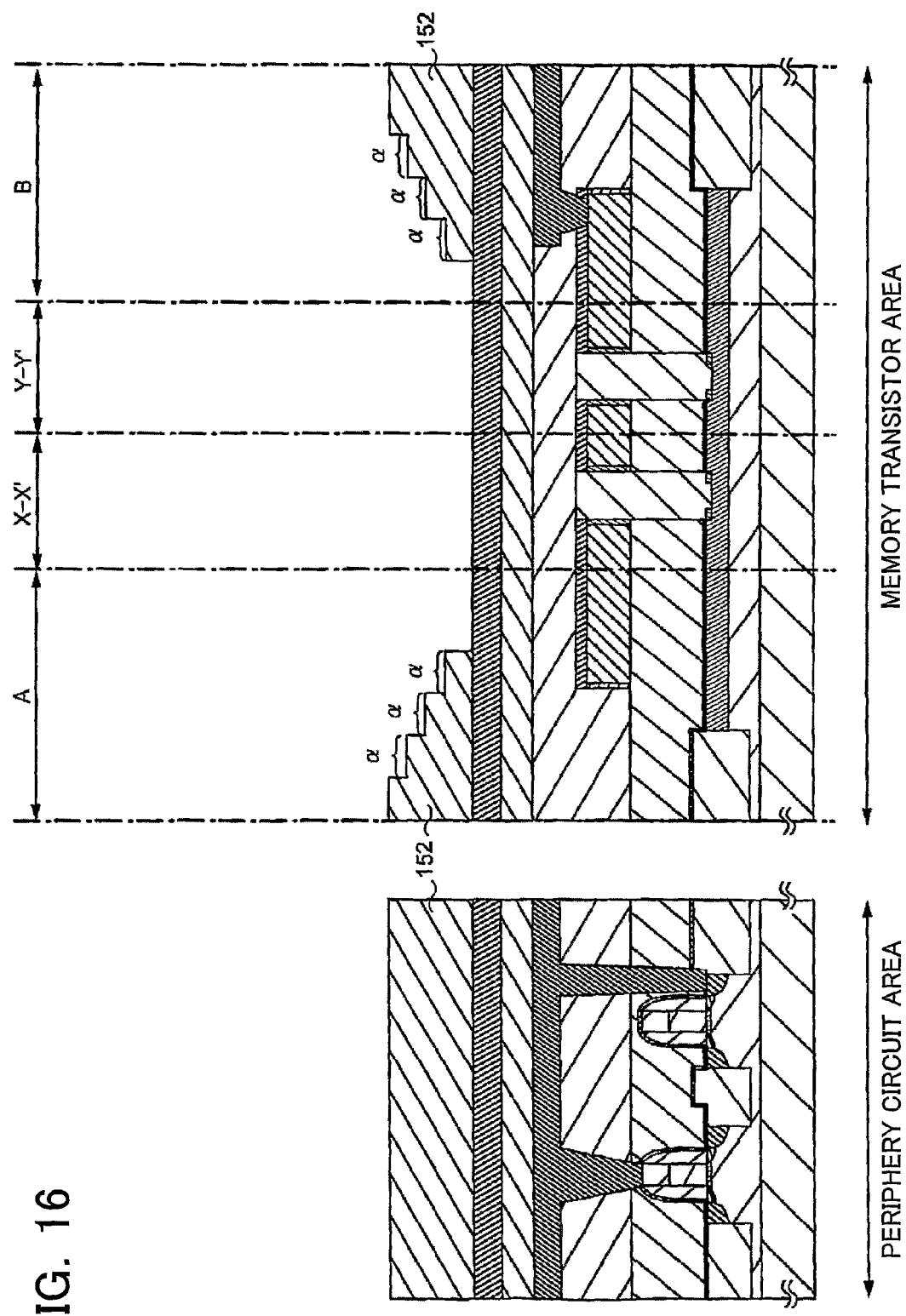
FIG. 16 illustrates a process of making a non-volatile semiconductor memory device 1 according to the first embodiment of the present invention.
Figure 17:
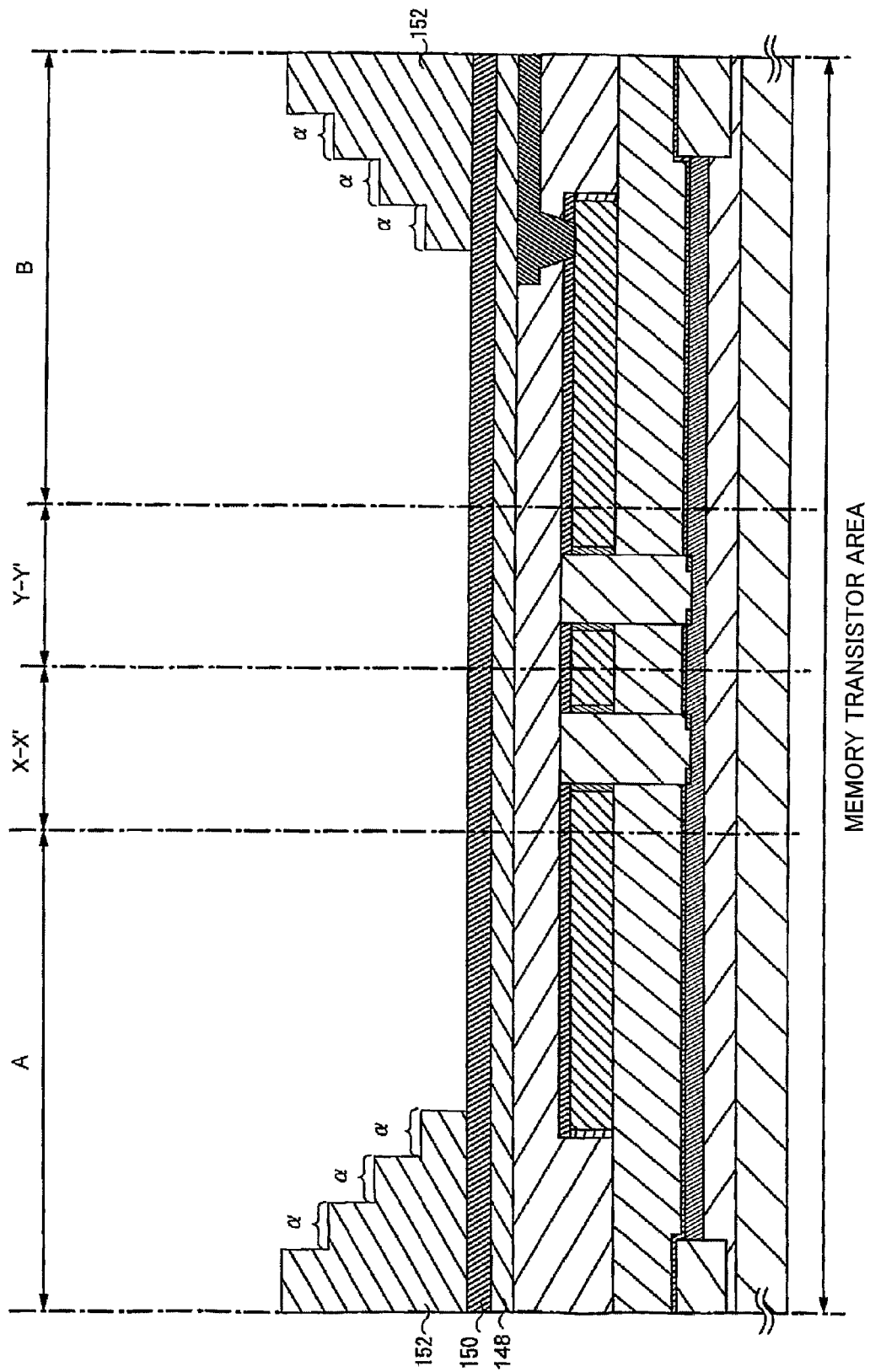
FIG. 17 illustrates a process of making a non-volatile semiconductor memory device 1 according to the first embodiment of the present invention.

The photoresist 154 is then subject to the second resist slimming by a width [alpha]. Using the slimmed photoresist 154 as a mask, the silicon dioxide film 152 is anisotropically (vertically) dry etched for the third time (FIG. 14). The photoresist 154 is then subject to the third resist slimming by a width [alpha]. Using the additionally slimmed photoresist 154 as a mask, the silicon dioxide film 152 is dry etched for the fourth time. The dry etching removes the silicon dioxide film 152, in the memory transistor area, in a portion of the area A, an area (hereinafter referred to as a memory area) where the memory transistors are formed, and a portion of the area B. The silicon nitride film 150 as the etching stopper film is thus exposed (FIG. 15). The photoresist 154 is then removed. A four-stepped silicon dioxide film 152 is thus formed upward in the memory transistor area along its edge (FIG. 16). FIG. 17 only shows the memory transistor area in FIG. 16. As seen in FIG. 17, the four-stepped silicon dioxide film 152 is formed upward on both sides of the memory transistor area.

Although in the above examples, the resist slimming is performed three times and the silicon dioxide film 152 is dry-etched four times, the present invention is not limited thereto. The number of resist slimmings and dry etchings depend on the number of laminated memory cell layers. When the number of dry etchings after the resist slimming is n (n is a natural number), (n+1) memory cell layers are laminated.

The predetermined width [alpha] caused by the resist slimming depends on the contact hole diameter, the fabrication variation, and the combined shift in the process described below where the contact holes are formed on the word-line by a photo-etching process.

A silicon nitride film 156 is then deposited and a silicon dioxide film 158 is deposited. Amorphous silicon films (or polysilicon films) and silicon dioxide films are then alternately deposited to form a laminate of amorphous silicon films 160, 164, 168, and 172 and silicon dioxide films 162, 166, 170, and 174. Each amorphous silicon film (or polysilicon film) includes an impurity such as phosphorus (P) and serves as the word-line electrode. Each silicon dioxide film serves as an insulating layer between the control gates. Note that although this embodiment shows an example where four amorphous silicon films are laminated as the word-line electrodes, the present invention is not limited thereto. The number of laminated amorphous silicon films and silicon dioxide films may be increased as necessary.

Figure 18:
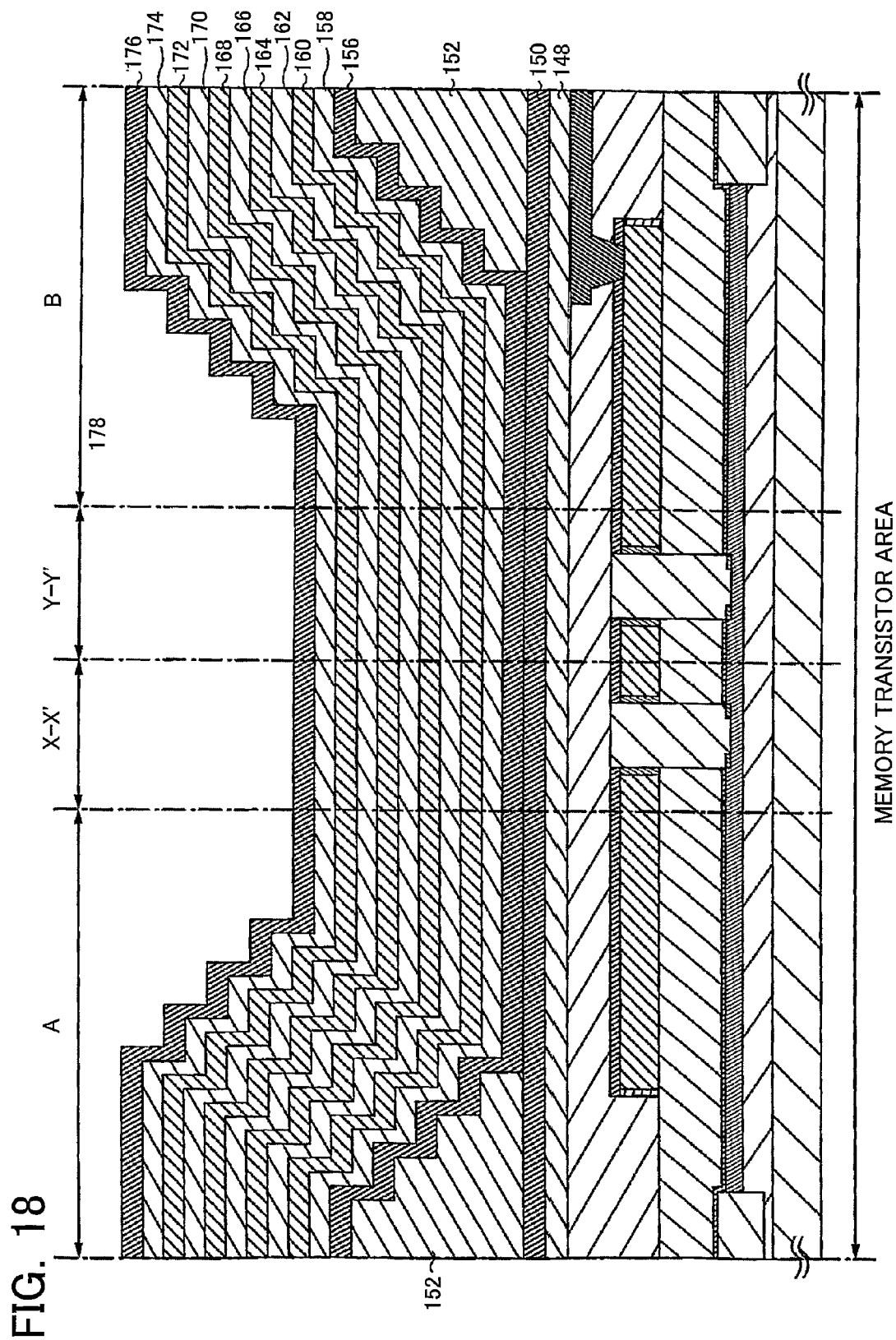
FIG. 18 illustrates a process of making a non-volatile semiconductor memory device 1 according to the first embodiment of the present invention.

A silicon nitride film 176 is then deposited on the silicon dioxide film 174 (FIG. 18).

Figure 19:
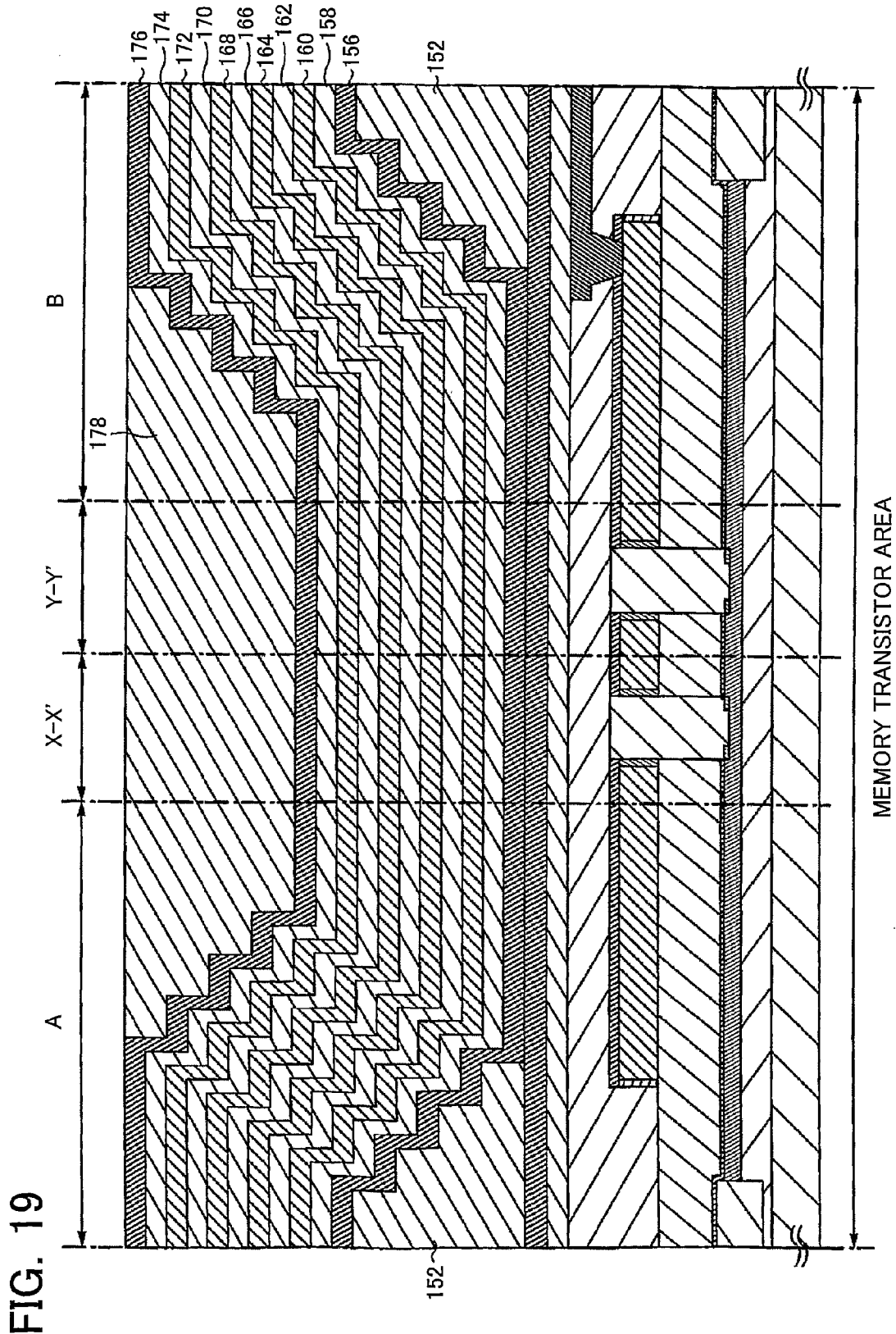
FIG. 19 illustrates a process of making a non-volatile semiconductor memory device 1 according to the first embodiment of the present invention.

A BPSG film 178, for example, is then deposited by a well-known CVD process. The film 178 is then planarized by a CMP process to be in the same plane as the silicon nitride film 176 (FIG. 19).

Figure 20:
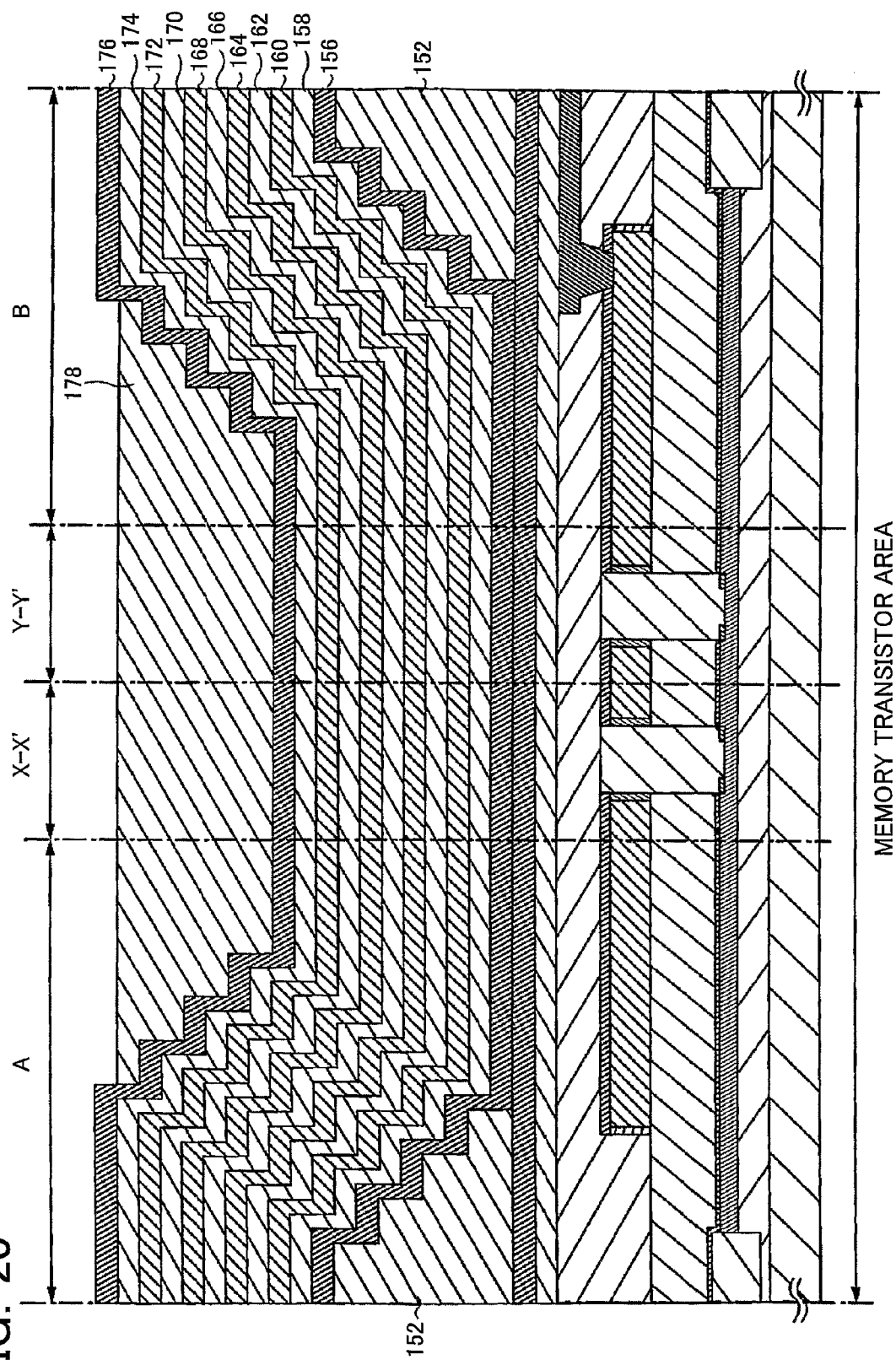
FIG. 20 illustrates a process of making a non-volatile semiconductor memory device 1 according to the first embodiment of the present invention.

Each of the silicon nitride film 176 and the silicon dioxide film 174 has four stepped-surfaces. The film 174 works as the interlayer dielectric film. The BPSG film 178 is selectively wet etched to the level of a back surface of the silicon nitride film 176 opposed to the upper surface of the top stepped-surface of the film 176. In other words, the film 178 is etched to the level of the upper surface of the top stepped-surface of the silicon dioxide film 174. The wet etching may be replaced with dry etching. After the above process, the top of the four stepped-surfaces of the silicon nitride film 176 is exposed from the silicon dioxide film 178 (FIG. 20).

Figure 21:
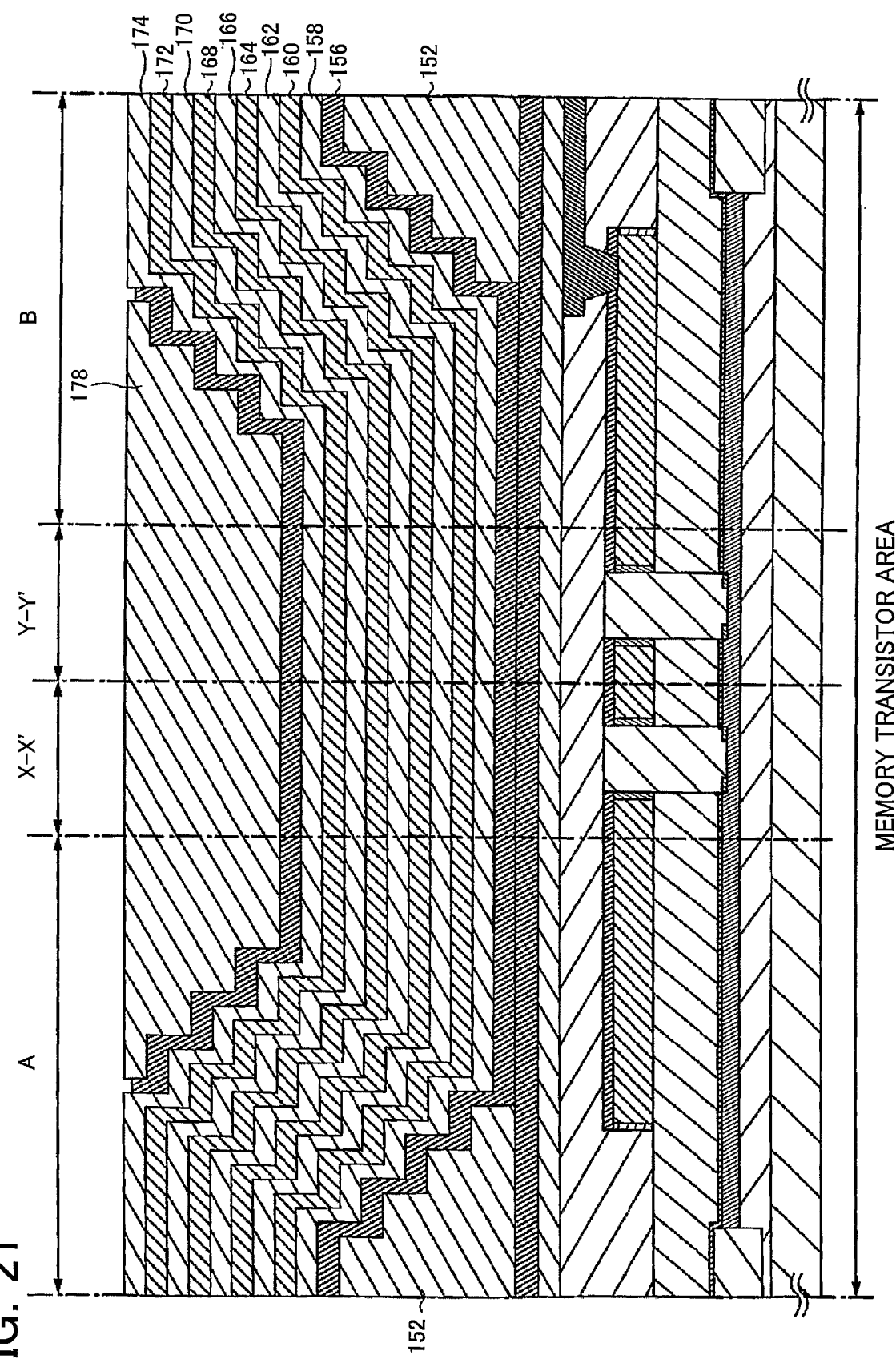
FIG. 21 illustrates a process of making a non-volatile semiconductor memory device 1 according to the first embodiment of the present invention.
Figure 22:
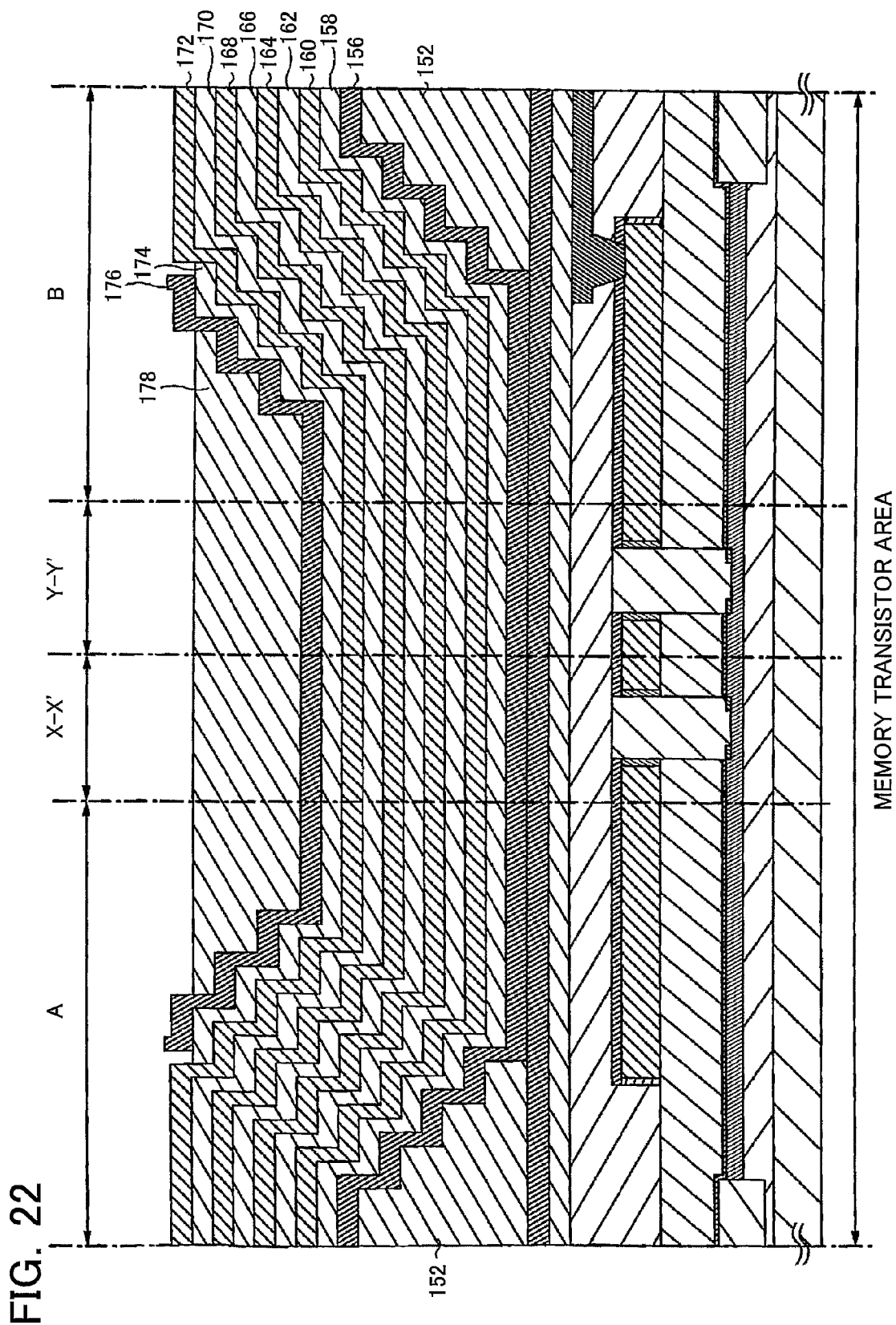
FIG. 22 illustrates a process of making a non-volatile semiconductor memory device 1 according to the first embodiment of the present invention.

The top of the four stepped-surfaces of the silicon nitride film 176 exposed from the silicon dioxide film 178 is selectively removed by wet etching. A dry etching may also be used. After the etching, the remainder of the silicon nitride film 176 is slightly depressed from the top surface of the silicon dioxide film 178 (FIG. 21). The amorphous silicon film 172 also has four stepped-surfaces. The film 172 works as the interlayer dielectric film. The silicon dioxide films 178 and 174 are wet etched to the level of a back surface of the amorphous silicon film 172 opposed to the upper surface of the top stepped-surface of the film 172. A dry etching may also be used. After the above process, the top of the four stepped-surfaces of the silicon dioxide film 174 is removed by etching, and the second of the four stepped-surfaces of the silicon nitride film 176 and the top of the four stepped-surfaces of the amorphous silicon film 172 are exposed from the silicon dioxide film 178 (FIG. 22).

Figure 23:
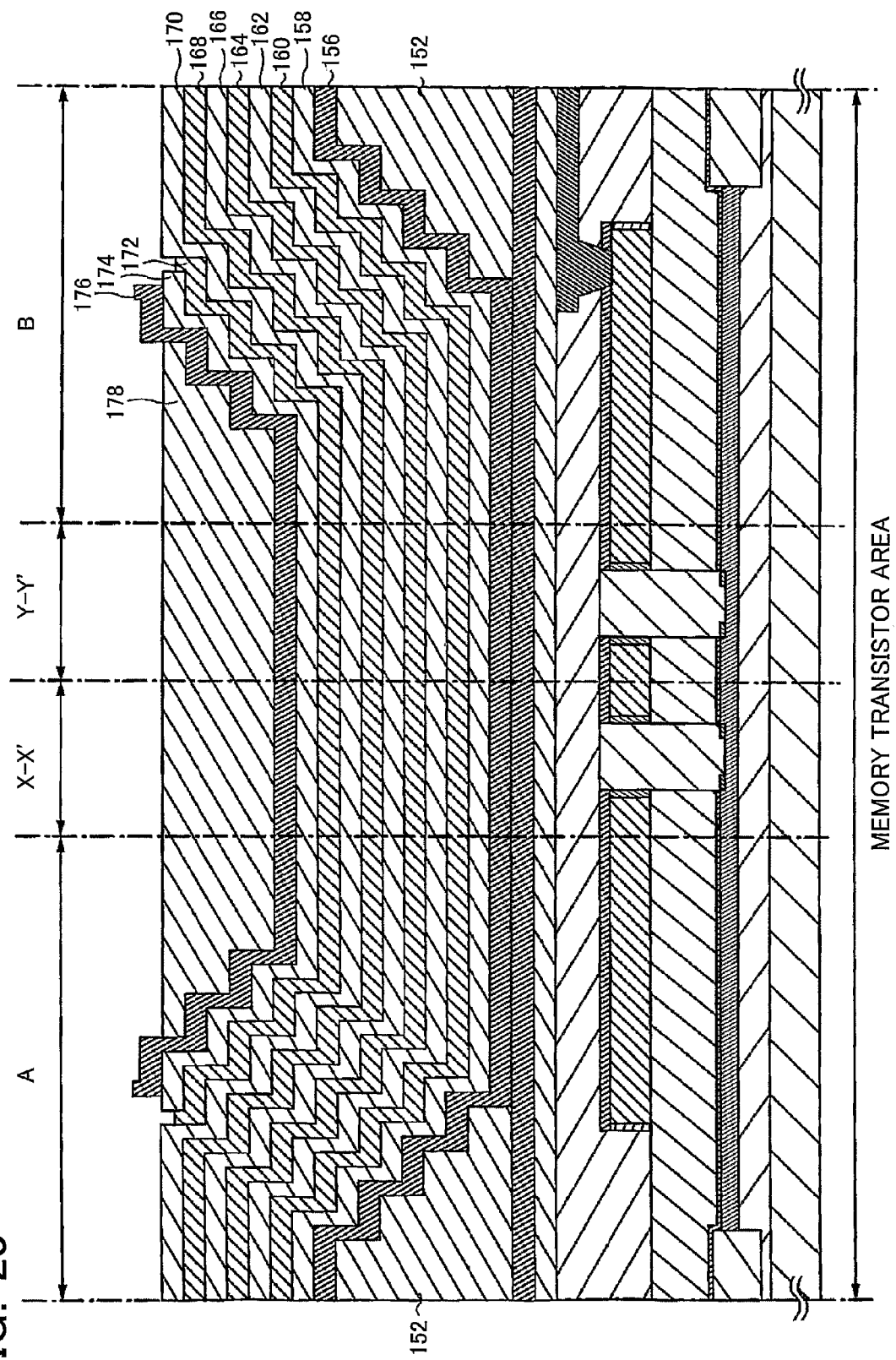
FIG. 23 illustrates a process of making a non-volatile semiconductor memory device 1 according to the first embodiment of the present invention.
Figure 24:
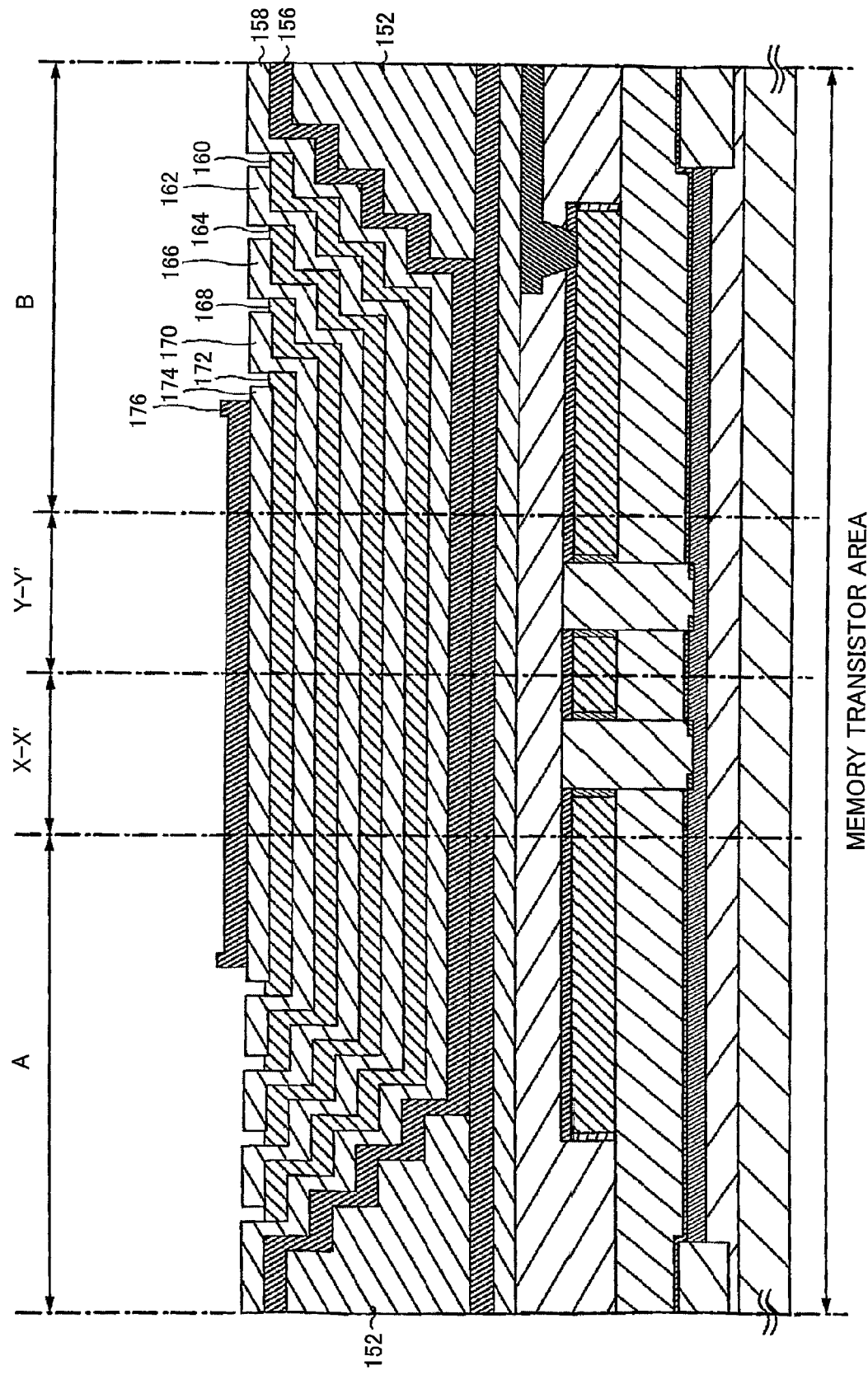
FIG. 24 illustrates a process of making a non-volatile semiconductor memory device 1 according to the first embodiment of the present invention.

The top stepped-surface of the amorphous silicon film 172 exposed from the silicon dioxide film 178 is then etched back and removed by RIE (FIG. 23). In the subsequent processes, each of the silicon dioxide films (174, 170, 166, 162, and 158), the silicon nitride film 176, each of the amorphous silicon films (172, 168, 164, and 160) are wet etched or dry etched as described above. The four stepped-surfaces are thus selectively etched away one by one. The etching is repeated to provide the structure shown in FIG. 24. In FIG. 24, the amorphous silicon film 172 leaves only its bottom. The amorphous silicon film 168 leaves a portion from its bottom to the bottom stepped-surface. The amorphous silicon film 164 leaves a portion from its bottom to the second bottom stepped-surface. The amorphous silicon film 160 leaves a portion from its bottom to the third bottom stepped-surfaces.

Figure 25:
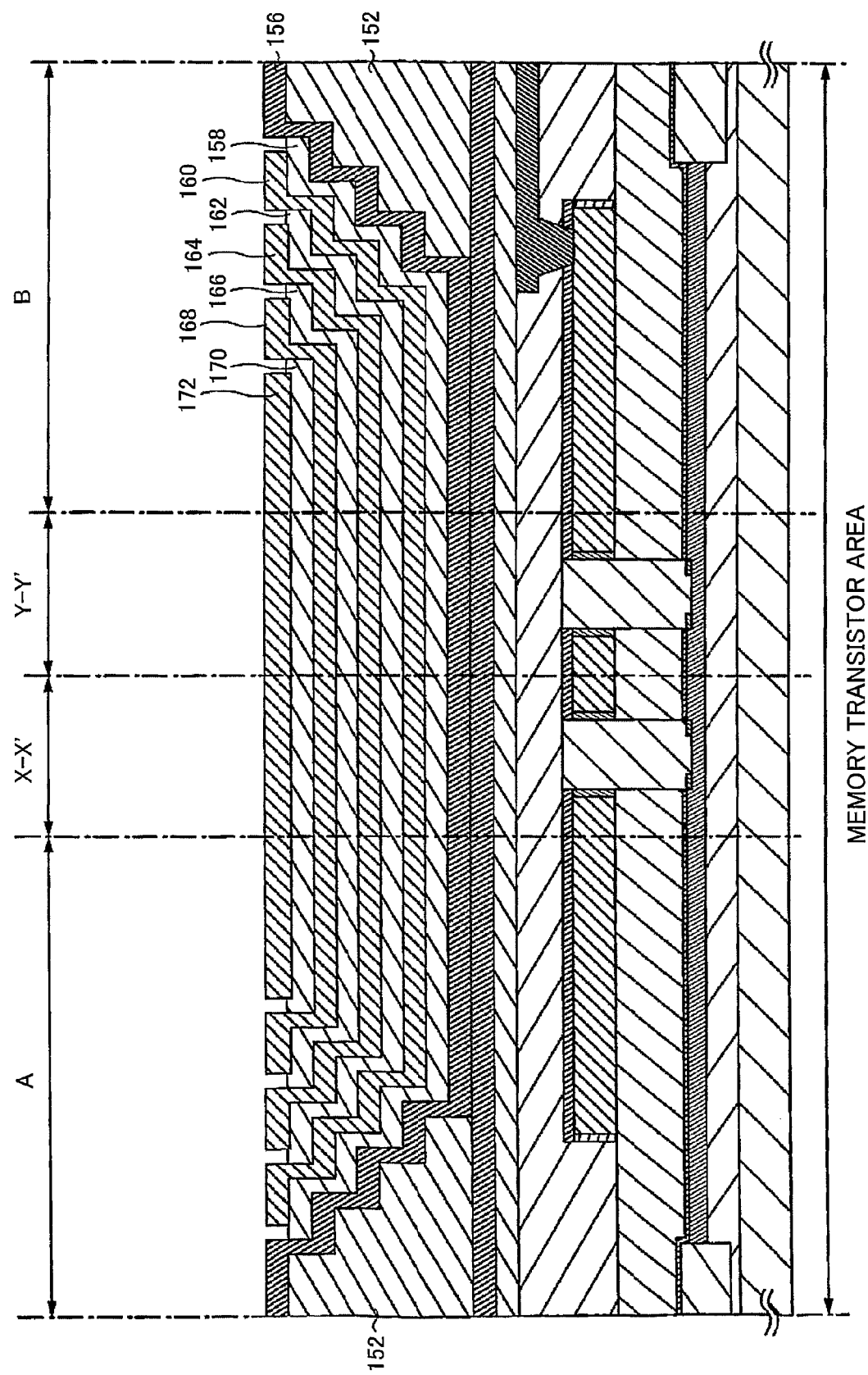
FIG. 25 illustrates a process of making a non-volatile semiconductor memory device 1 according to the first embodiment of the present invention.

The entire silicon nitride film 176 is then wet-etched or dry-etched away. The surfaces of the laminated silicon dioxide films are then exposed as follows. The whole upper surface of the bottom of the top silicon dioxide film 174 is exposed. The whole upper surface of the bottom of the four stepped-surfaces of the silicon dioxide film 170 is exposed. The whole upper surface of the second bottom of the four stepped-surfaces of the silicon dioxide film 166 is exposed. The whole upper surface of the third bottom of the four stepped-surfaces of the silicon dioxide film 162 is exposed. The whole upper surface of the top of the four stepped-surfaces of the silicon dioxide film 158 is exposed. The silicon dioxide films 174, 170, 166, 162, and 158 are selectively wet-etched or dry-etched away. The surfaces of the four laminated amorphous silicon films are then exposed as follows (FIG. 25). The whole upper surface of the bottom of the top amorphous silicon film 172 is exposed. The whole upper surface of the bottom stepped-surface of the amorphous silicon film 168 is exposed. The whole upper surface of the second bottom stepped-surface of the amorphous silicon film 164 is exposed. The whole upper surface of the third bottom stepped-surface of the amorphous silicon film 160 is exposed. After the above process, the upper surface of the bottom of the top amorphous silicon film and the upper surfaces of the top stepped-surfaces of the other etched amorphous silicon films are at the same height.

Figure 26:
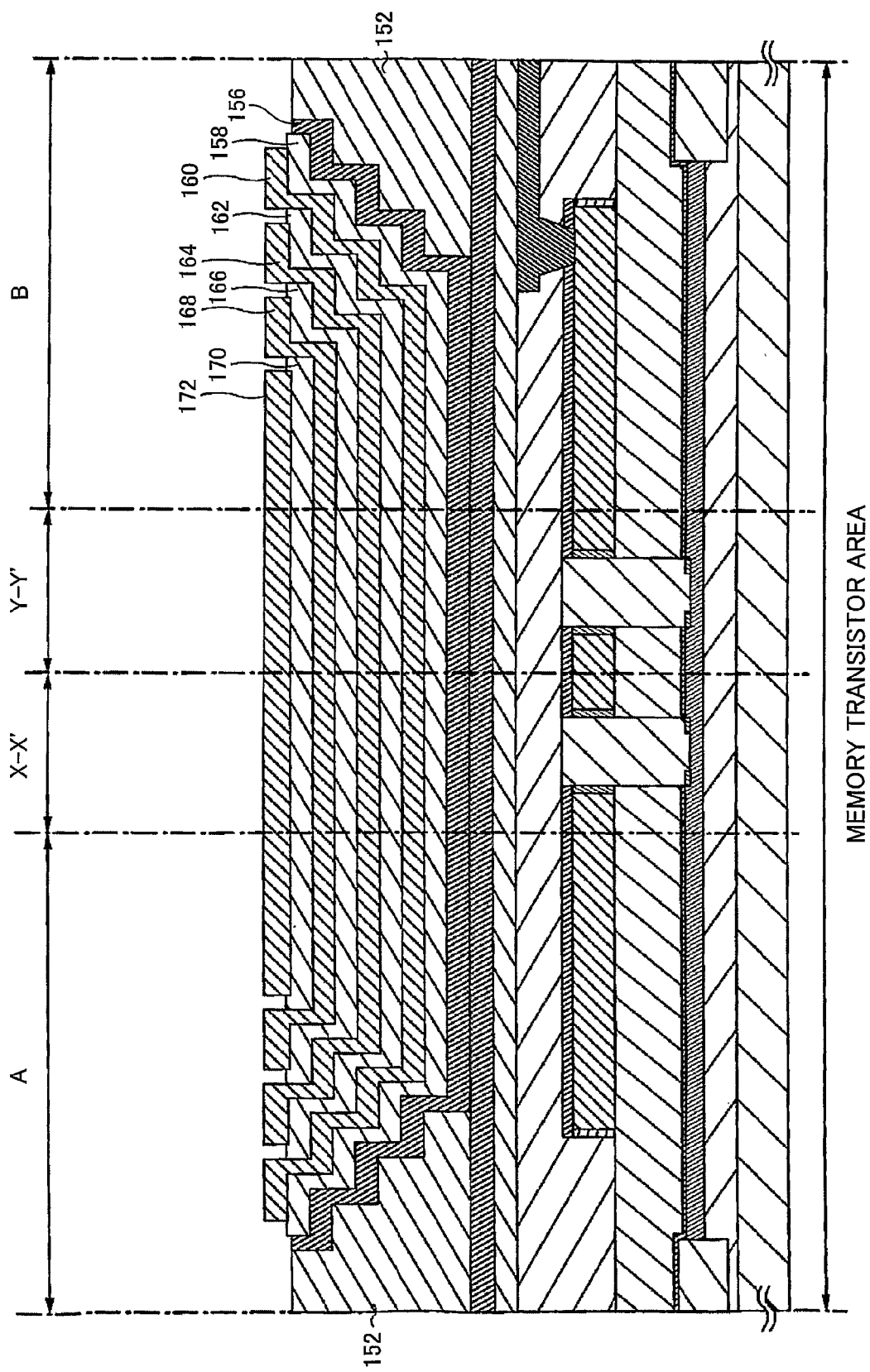
FIG. 26 illustrates a process of making a non-volatile semiconductor memory device 1 according to the first embodiment of the present invention.

The bottom silicon nitride film 156 of the laminated films is then selectively removed by wet etching. A dry etching may also be used. After the above process, the whole upper surface of the top of the four stepped-surfaces of the stepped silicon dioxide film 152 is exposed (FIG. 26).

Note that the processes shown in FIGS. 20 to 25 may be replaced with the following processes. The silicon dioxide film 178 is deposited by a well-known CVD process. The film 178 is then planarized by a CMP process to be in the same plane as the silicon nitride film 156. This may drastically shorten the processes.

Figure 27:
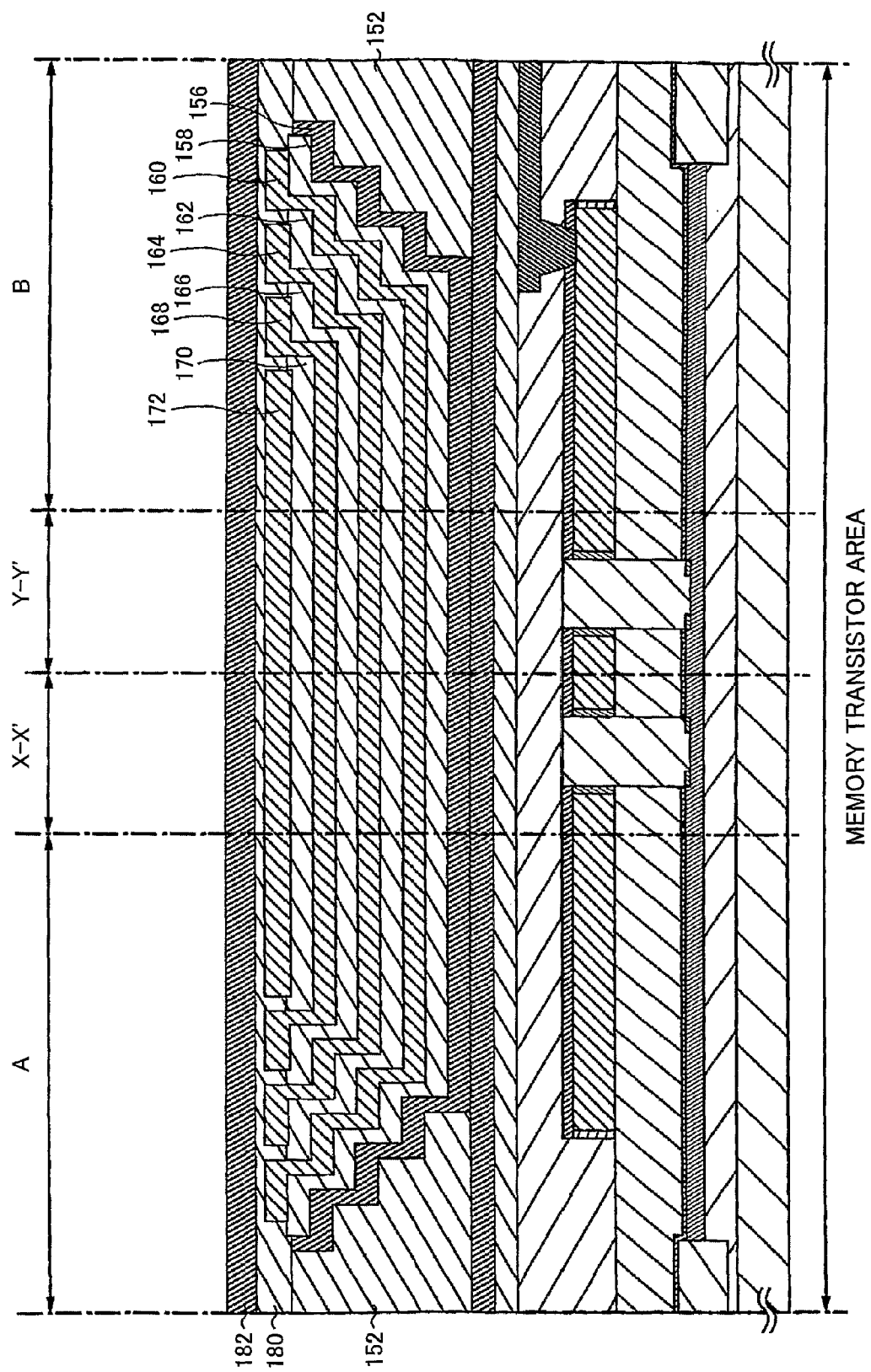
FIG. 27 illustrates a process of making a non-volatile semiconductor memory device 1 according to the first embodiment of the present invention.

A silicon dioxide film 180 is then deposited over the entire substrate by a well-known CVD process. The film 180 acts as the interlayer dielectric film between the memory cell layers and the upper select transistor SDTr layer. A silicon nitride film 182 is then deposited on the silicon dioxide film 180 by a CVD process or a plasma CVD process (FIG. 27).

Figure 28:
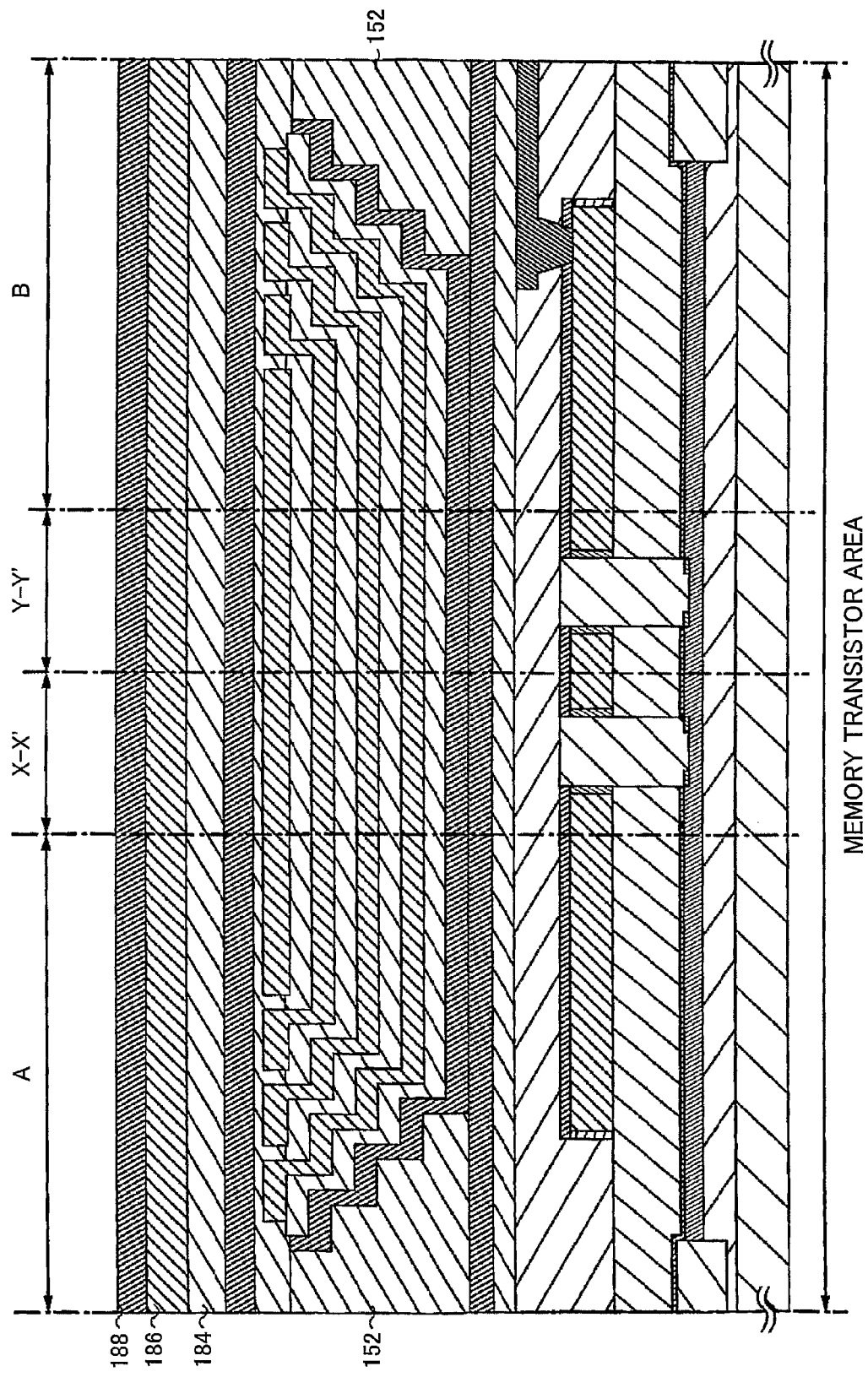
FIG. 28 illustrates a process of making a non-volatile semiconductor memory device 1 according to the first embodiment of the present invention.

To form the upper select transistor SDTr layer, the silicon nitride film 188 is formed as follows (FIG. 28). A silicon dioxide film 184 is deposited on the silicon nitride film 182 by a well-known CVD process. An amorphous silicon film (or polysilicon film) 186 is then deposited on the silicon dioxide film 184. The silicon film 186 includes an impurity such as phosphorus (P).

Figure 29:
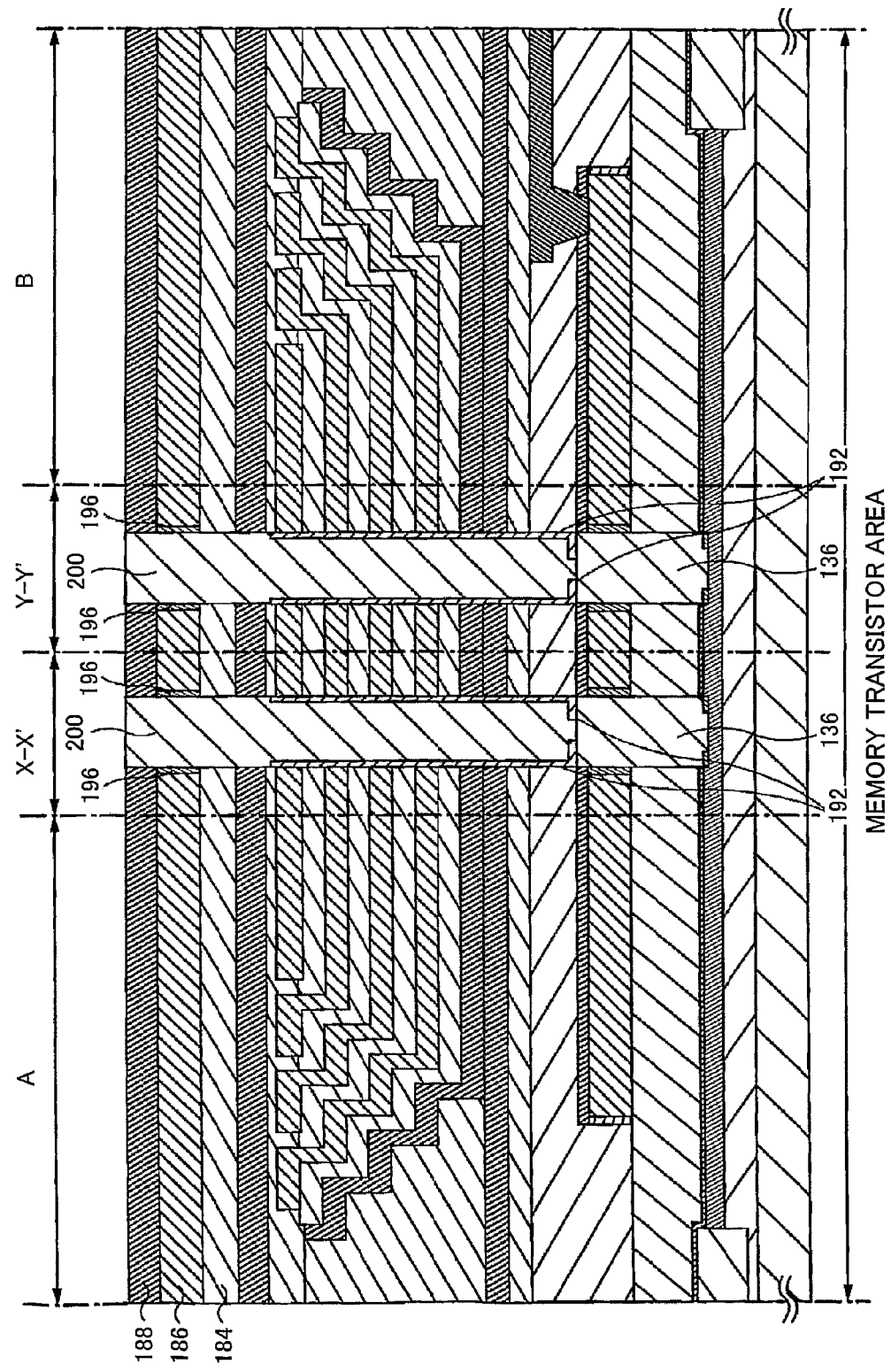
FIG. 29 illustrates a process of making a non-volatile semiconductor memory device 1 according to the first embodiment of the present invention.

To form the columnar semiconductors (body portions) of the memory transistors and the upper select transistors SDTr, memory plug holes 190 (not shown) are then formed. The first silicon dioxide film (the first insulating layer), the silicon nitride film, and the second silicon dioxide film (the second insulating layer) are deposited in sequence. A so-called ONO film 192 is thus formed. The silicon nitride film works as the charge accumulation layer of the memory transistor. A photoresist 194 (not shown) is then formed and etched back. This removes portions of the ONO film 192 that correspond to the amorphous silicon film 186 and the silicon dioxide film 184 in the periphery circuit area and the memory plug hole interior wall. The photoresist 194 is removed. The resultant structure is heated to form a thermally-oxidized film (the second gate-insulating layer) 196. The film 196 serves as the gate-insulating layer of the upper select transistor SDTr. A silicon nitride film is deposited on the side wall and bottom of each hole. A spacer silicon nitride film 198 (not shown) is formed in the memory plug hole by anisotropic etching. The ONO film 192 and the spacer silicon nitride film 198 on each hole bottom are etched back to make communication with the channel portion 136 of the lower portion select gate. The spacer silicon nitride film 198 is removed. The amorphous silicon film is then deposited and CMP processed, forming columnar amorphous silicon layers 200 (the second columnar semiconductors) (FIG. 29). The silicon layers 200 work as the memory cell channel portions and the upper select transistor SDTr channel portions.

Figure 30:
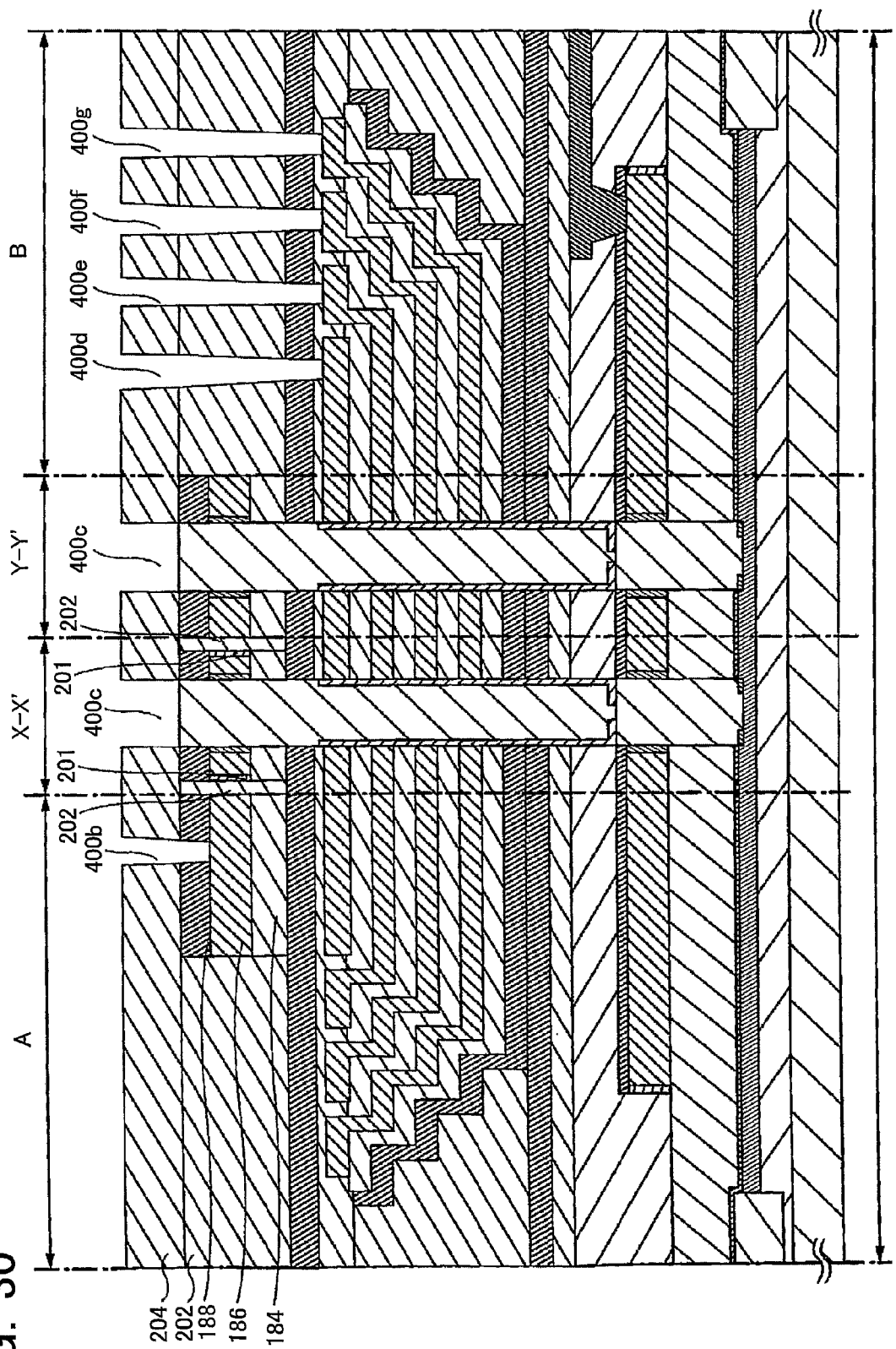
FIG. 30 illustrates a process of making a non-volatile semiconductor memory device 1 according to the first embodiment of the present invention.

The silicon nitride film 188, the amorphous silicon film 186, and the silicon dioxide film 184 are then etched by PEP and RIE, forming the gate electrodes of the upper select transistor SDTr. A titanium film is then formed and heated, forming a titanium silicide film 201. Note that the titanium silicide film may be replaced with other films such as a cobalt salicide film or a nickel salicide film, or the salicide film may not be formed. As an interlayer dielectric film, a silicon dioxide film 202 is deposited and planarized by a CMP process. A silicon dioxide film 204 is then deposited. A contact hole 400a (not shown) for a wiring in the periphery circuit is formed by PEP and RIE. Contact holes 400d, 400e, 400f, and 400g for the word-line electrodes are collectively formed on the amorphous silicon films (186, 172, 168, 164, and 160) by a single PEP and a single RIE. A contact hole 400b for the upper portion select gate is then formed by PEP and RIE. Contact holes 400c for the memory cell channel portions and the upper select transistor SDTr channel portions are formed by PEP and RIE (FIG. 30).

Figure 31:
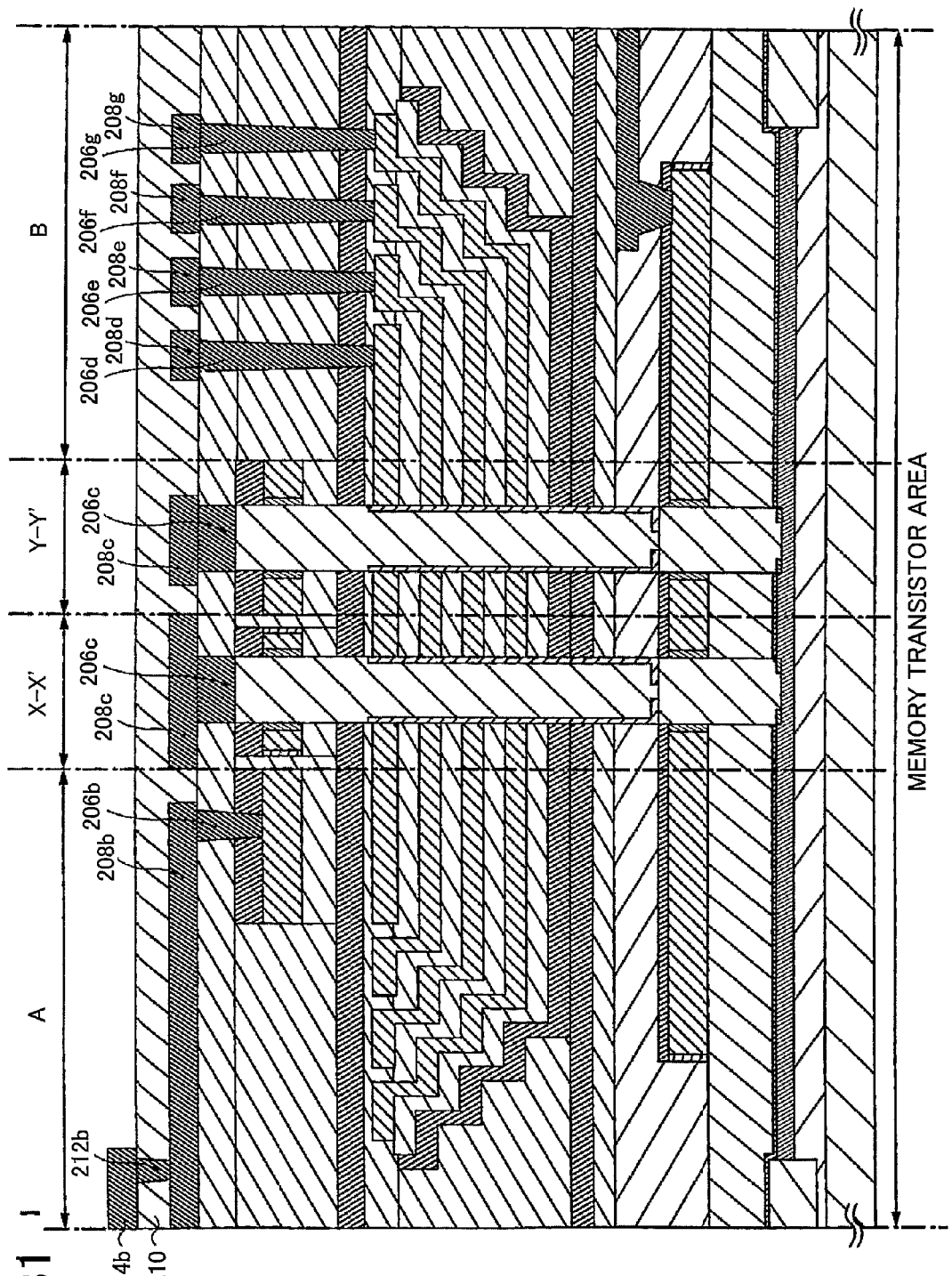
FIG. 31 illustrates a process of making a non-volatile semiconductor memory device 1 according to the first embodiment of the present invention.
Figure 32:
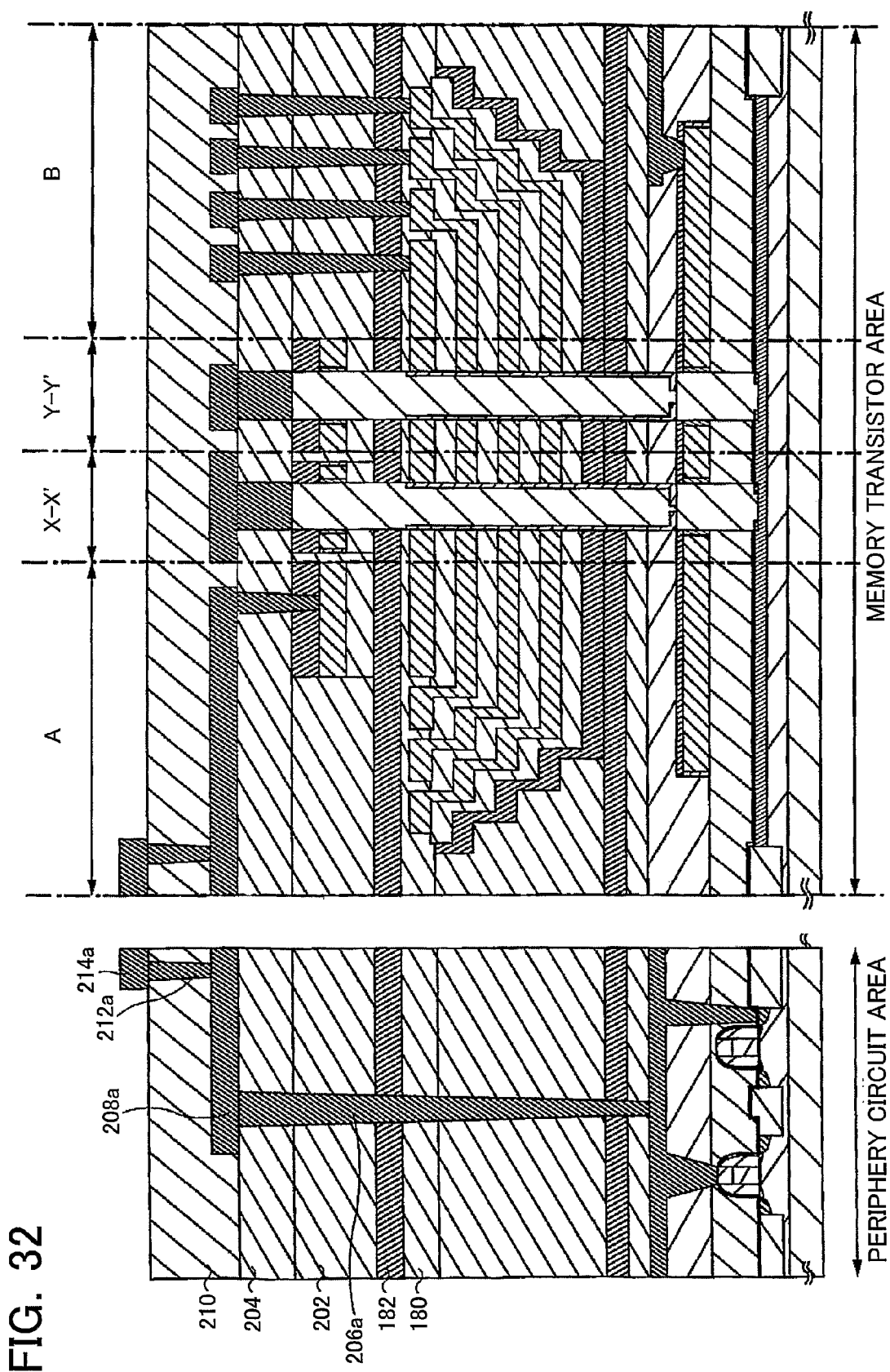
FIG. 32 illustrates a process of making a non-volatile semiconductor memory device 1 according to the first embodiment of the present invention.

The contact holes 400a (not shown), 400b, 400c, 400d, 400e, 400f, and 400g are thus formed by a photo-etching process. A tungsten film is then formed on the contact holes, and planarized by a CMP process. Tungsten plugs 206a (not shown), 206b, 206c, 206d, 206e, 206f, and 206g are thus formed (FIG. 31).

An aluminum (Al) film is then formed and photo etched. Electrodes 208a (not shown), 208b, 208c, 208d, 208e, 208f, and 208g are thus formed. An interlayer dielectric film 210 is then formed and planarized by a CMP process. Contact holes 402a and 402b (either not shown) are formed by PEP. A tungsten film is then embedded in the holes and CMP processed, forming tungsten plugs 212a (not shown) and 212b. An aluminum film is then formed and etched by PEP, forming aluminum electrodes 214a (not shown) and 214b (FIG. 31).

The above processes may make the non-volatile semiconductor memory device 1 according to the first embodiment of the present invention. Note that although in the above manufacturing processes, the memory cell layers' channels and the upper select transistor SDTr layers' channels are formed at the same time, the present invention is not limited thereto. The memory cell layers' memory holes and channels and the upper select transistor SDTr layers' transistor plug holes and channels may be formed separately.

In the non-volatile semiconductor memory device 1 according to the first embodiment of the present invention formed in the above processes, all contact areas of the amorphous silicon films as the word-line electrodes are in the same plane. The contact holes are therefore at the same depth (height). This eliminates the thick stopper film and the very highly selective etching. It is thus easy to fabricate the non-volatile semiconductor memory device 1 according to the first embodiment of the present invention. The fact that the thick stopper film is not necessary may prevent the extension of the distances between the upper select transistors SDTr and the word-lines. This may prevent increase in the resistance of the channel-portion amorphous silicon and decrease in the current therethrough.

The invention claimed is:
1. A non-volatile semiconductor memory device comprising:
  a substrate;
  a first word-line provided above the substrate surface, the first word-line having a plate shape in a first area where a memory cell is formed, and a first folded portion in a second area adjacent to the first area, the first folded portion further including a first plate-shape end portion parallel to the substrate at an end thereof;

a second word-line provided above the first word-line surface, the second word-line having a plate shape in the first area and a second folded portion in the second area, the second folded portion further including a second plate-shape end portion parallel to the substrate at the end thereof;

a plurality of metal wirings electrically connecting the first and second word-lines to a driver circuit; and a plurality of contacts electrically connecting the first plate-shape end portion and the second plate-shape end portion to the metal wirings, the first plate-shape end portion and the second plate-shape end portion being formed at a same height from the substrate.

2. The non-volatile semiconductor memory device according to claim 1, further comprising:

a columnar semiconductor formed perpendicular to the substrate;

a first insulating layer formed around the columnar semiconductor;

a charge accumulation layer formed around the first insulating layer; and a second insulating layer formed around the charge accumulation layer, wherein the columnar semiconductor, the first insulating layer, the charge accumulation layer, and the second insulating layer together form an electrically rewritable memory cell, the memory cell is provided in a plurality and the memory cells are connected in series to form a memory string.

3. The non-volatile semiconductor memory device according to claim 2, wherein the memory string is provided in a plurality, and the memory strings are arranged in a matrix on the substrate.

4. The non-volatile semiconductor memory device according to claim 3, wherein each of the first and second word-lines is a plate electrode commonly connected to the memory strings arranged in a matrix.

5. The non-volatile semiconductor memory device according to claim 1, further comprising:

a columnar semiconductor formed perpendicular to the substrate;

a first insulating layer formed around the columnar semiconductor;

a charge accumulation layer formed around the first insulating layer; and a second insulating layer formed around the charge accumulation layer, wherein the first and second word-lines are formed surrounding the second insulating layer, the columnar semiconductor, the first insulating layer, the charge accumulation layer, the second insulating layer, and the first word-line or the second word-line together form an electrically rewritable memory cell, and the memory cell is provided in a plurality and the memory cells are connected in series to form a memory string.

6. The non-volatile semiconductor memory device according to claim 5, wherein the memory string is provided in a plurality, and the memory strings are arranged in a matrix on the substrate.

7. The non-volatile semiconductor memory device according to claim 5, wherein a bit-line select transistor is provided in the memory string and is connected to a bit-line, and the first plate-shape end portion and the second plate-shape end portion are formed below the bit-line select transistor.

8. The non-volatile semiconductor memory device according to claim 1, wherein the second word-line is a word-line in the top layer of the memory string, and the first word-line is a word-line formed in a layer below the second word-line.

9. The non-volatile semiconductor memory device according to claim 1, wherein the first folded portion has more steps than the second folded portion.

10. A method of making a non-volatile semiconductor memory device, comprising:

forming a first insulating layer on a semiconductor substrate;

forming a resist of a desired pattern on the first insulating layer and anisotropically etching the first insulating layer;

performing n (n is a natural number) repetition of reduction of the resist by a predetermined width and additional anisotropic etching of the first insulating layer to make an opening on the first insulating layer;

laminating (n+1) alternate layers of a conductive film and a second insulating layer on the first insulating layer with the opening;

alternately and selectively etching the conductive film and the second insulating layer such that plate-shape end portions of the laminated conductive films are exposed, and the plate-shape end portions of the laminated conductive films have a same height from the substrate; and forming, on each of the plate shape end portions, a contact hole connected to a driver circuit, wherein n (n is a natural number) depends on the number (n+1) of laminated memory cell layers.

11. The method of making a non-volatile semiconductor memory device according to claim 10, wherein the first insulating layer is formed into a stepped structure by performing n (n is a natural number) repetition of reduction of the resist by a predetermined width and anisotropic etching.

* * * * *